(12) United States Patent
Kawakubo

(10) Patent No.: US 8,730,744 B2
(45) Date of Patent: May 20, 2014

(54) SEMICONDUCTOR MEMORY WITH REDUNDANT WORD LINES, SYSTEM, AND METHOD OF MANUFACTURING SEMICONDUCTOR MEMORY

(75) Inventor: Tomohiro Kawakubo, Kokubunji (JP)

(73) Assignee: Fujitsu Semiconductor Limited, Yokohama (JP)

( * ) Notice: Subject to any disclaimer, the term of this patent is extended or adjusted under 35 U.S.C. 154(b) by 35 days.

(21) Appl. No.: 13/474,502

(22) Filed: May 17, 2012

(65) Prior Publication Data

US 2012/0327724 A1    Dec. 27, 2012

(30) Foreign Application Priority Data

Jun. 27, 2011   (JP) .................................. 2011-141845

(51) Int. Cl.
  *G11C 8/10*  (2006.01)
  *G11C 7/06*  (2006.01)
(52) U.S. Cl.
  USPC .. 365/189.07; 365/200; 365/201; 365/230.06
(58) Field of Classification Search
  None
  See application file for complete search history.

(56) References Cited

U.S. PATENT DOCUMENTS

| | | | | |
|---|---|---|---|---|
| 5,732,029 A | * | 3/1998 | Lee et al. ........................ | 365/200 |
| 5,764,576 A | * | 6/1998 | Hidaka et al. ................. | 365/200 |
| 6,160,745 A | * | 12/2000 | Hashimoto .................... | 365/200 |
| 6,215,712 B1 | | 4/2001 | Yanagisawa | |
| 7,397,715 B2 | * | 7/2008 | Lim et al. ...................... | 365/201 |

FOREIGN PATENT DOCUMENTS

| | | |
|---|---|---|
| JP | 11-203894 A | 7/1999 |
| JP | 2000-260199 A | 9/2000 |

* cited by examiner

*Primary Examiner* — Tan T. Nguyen
(74) *Attorney, Agent, or Firm* — Arent Fox LLP

(57) ABSTRACT

A semiconductor memory has a memory cell array having a plurality of real word lines, a plurality of redundant word lines, a plurality of bit lines crossing with the real and redundant word lines, a plurality of memory cells provided at crossing section of the real and redundant word lines and the bit lines, and a row selection circuit for selecting the real word line or the redundant word line in accordance with a row address being supplied. The row selection circuit selects the real word line or the redundant word line at an ordinary operation, and multi-selects the redundant word lines at a first test mode.

13 Claims, 24 Drawing Sheets

| | RWL0<br>WL0<br>WL1<br>⋮<br>WL510<br>WL511<br>RWL1 | | | | | | | | | | | | |
|---|---|---|---|---|---|---|---|---|---|---|---|---|---|
| | RBLK0 | SAA | RBLK1 | RBLK2 | SAA | RBLK3 | RBLK4 | SAA | RBLK5 | RBLK6 | --- | RBLK13 | RBLK14 | SAA | RBLK15 |

| BRA12 | BRA11 | BRA10 | BRA9 | |
|---|---|---|---|---|
| 0 | 0 | 0 | 0 | |
| 0 | 0 | 0 | 1 | |
| 0 | 0 | 1 | 0 | |
| 0 | 0 | 1 | 1 | |
| 0 | 1 | 0 | 0 | |
| 0 | 1 | 0 | 1 | |
| 0 | 1 | 1 | 0 | |
| --- | --- | --- | --- | |
| 1 | 1 | 0 | 1 | |
| 1 | 1 | 1 | 0 | |
| 1 | 1 | 1 | 1 | |

FIG. 7

| RBLK | RWL | FA12→FB12 | FA11→FB11 | FA10→FB10 | FA9→FB9 | FA8→FB8 | FB12-FB8 (RFST=L) |
|---|---|---|---|---|---|---|---|
| RBLK0 | RWL0 | | | | | | 00000 |
| | RWL1 | | | | | ▽ | 00001 |
| RBLK1 | RWL0 | | | | ▽ | | 00010 |
| | RWL1 | | | | ▽ | ▽ | 00011 |
| RBLK2 | RWL0 | | | ▽ | | | 00100 |
| | RWL1 | | | ▽ | | ▽ | 00101 |
| RBLK3 | RWL0 | | | ▽ | ▽ | | 00110 |
| | RWL1 | | | ▽ | ▽ | ▽ | 00111 |
| RBLK4 | RWL0 | | ▽ | | | | 01000 |
| | RWL1 | | ▽ | | | ▽ | 01001 |
| RBLK5 | RWL0 | | ▽ | | ▽ | | 01010 |
| | RWL1 | | ▽ | | ▽ | ▽ | 01011 |
| RBLK6 | RWL0 | | ▽ | ▽ | | | 01100 |
| | RWL1 | | ▽ | ▽ | | ▽ | 01101 |
| RBLK7 | RWL0 | | ▽ | ▽ | ▽ | | 01110 |
| | RWL1 | | ▽ | ▽ | ▽ | ▽ | 01111 |
| RBLK8 | RWL0 | ▽ | | | | | 10000 |
| | RWL1 | ▽ | | | | ▽ | 10001 |
| RBLK9 | RWL0 | ▽ | | | ▽ | | 10010 |
| | RWL1 | ▽ | | | ▽ | ▽ | 10011 |
| RBLK10 | RWL0 | ▽ | | ▽ | | | 10100 |
| | RWL1 | ▽ | | ▽ | | ▽ | 10101 |
| RBLK11 | RWL0 | ▽ | | ▽ | ▽ | | 10110 |
| | RWL1 | ▽ | | ▽ | ▽ | ▽ | 10111 |
| RBLK12 | RWL0 | ▽ | ▽ | | | | 11000 |
| | RWL1 | ▽ | ▽ | | | ▽ | 11001 |
| RBLK13 | RWL0 | ▽ | ▽ | | ▽ | | 11010 |
| | RWL1 | ▽ | ▽ | | ▽ | ▽ | 11011 |
| RBLK14 | RWL0 | ▽ | ▽ | ▽ | | | 11100 |
| | RWL1 | ▽ | ▽ | ▽ | | ▽ | 11101 |
| RBLK15 | RWL0 | ▽ | ▽ | ▽ | ▽ | | 11110 |
| | RWL1 | ▽ | ▽ | ▽ | ▽ | ▽ | 11111 |

FIG. 8

| FRHITZ | HITR0Z | HITR1Z | FRA12 | FRA11 | FRA10 | FRA9 | RBLK |
|---|---|---|---|---|---|---|---|
| FRHIT0Z=1 | 1 | 0 | 0 | 0 | 0 | 0 | RBLK0 |
| FRHIT1Z=1 | 0 | 1 | | | | | |
| FRHIT2Z=1 | 1 | 0 | 0 | 0 | 0 | 1 | RBLK1 |
| FRHIT3Z=1 | 0 | 1 | | | | | |
| FRHIT4Z=1 | 1 | 0 | 0 | 0 | 1 | 0 | RBLK2 |
| FRHIT5Z=1 | 0 | 1 | | | | | |
| FRHIT6Z=1 | 1 | 0 | 0 | 0 | 1 | 1 | RBLK3 |
| FRHIT7Z=1 | 0 | 1 | | | | | |
| FRHIT8Z=1 | 1 | 0 | 0 | 1 | 0 | 0 | RBLK4 |
| FRHIT9Z=1 | 0 | 1 | | | | | |
| FRHIT10Z=1 | 1 | 0 | 0 | 1 | 0 | 1 | RBLK5 |
| FRHIT11Z=1 | 0 | 1 | | | | | |
| FRHIT12Z=1 | 1 | 0 | 0 | 1 | 1 | 0 | RBLK6 |
| FRHIT13Z=1 | 0 | 1 | | | | | |
| FRHIT14Z=1 | 1 | 0 | 0 | 1 | 1 | 1 | RBLK7 |
| FRHIT15Z=1 | 0 | 1 | | | | | |
| FRHIT16Z=1 | 1 | 0 | 1 | 0 | 0 | 0 | RBLK8 |
| FRHIT17Z=1 | 0 | 1 | | | | | |
| FRHIT18Z=1 | 1 | 0 | 1 | 0 | 0 | 1 | RBLK9 |
| FRHIT19Z=1 | 0 | 1 | | | | | |
| FRHIT20Z=1 | 1 | 0 | 1 | 0 | 1 | 0 | RBLK10 |
| FRHIT21Z=1 | 0 | 1 | | | | | |
| FRHIT22Z=1 | 1 | 0 | 1 | 0 | 1 | 1 | RBLK11 |
| FRHIT23Z=1 | 0 | 1 | | | | | |
| FRHIT24Z=1 | 1 | 0 | 1 | 1 | 0 | 0 | RBLK12 |
| FRHIT25Z=1 | 0 | 1 | | | | | |
| FRHIT26Z=1 | 1 | 0 | 1 | 1 | 0 | 1 | RBLK13 |
| FRHIT27Z=1 | 0 | 1 | | | | | |
| FRHIT28Z=1 | 1 | 0 | 1 | 1 | 1 | 0 | RBLK14 |
| FRHIT29Z=1 | 0 | 1 | | | | | |
| FRHIT30Z=1 | 1 | 0 | 1 | 1 | 1 | 1 | RBLK15 |
| FRHIT31Z=1 | 0 | 1 | | | | | |

SEMICONDUCTOR MEMORY WITH REDUNDANT WORD LINES, SYSTEM, AND METHOD OF MANUFACTURING SEMICONDUCTOR MEMORY

CROSS-REFERENCE TO RELATED APPLICATIONS

This application is based upon and claims the benefit of priority of the prior Japanese Patent Application No. 2011-141845, filed on Jun. 27, 2011, the entire contents of which are incorporated herein by reference.

FIELD

The present embodiments relate to a semiconductor memory having redundant word lines, a system in which the semiconductor memory is mounted, and a method for manufacturing the semiconductor memory.

BACKGROUND

A method is proposed by which a burn-in test of a semiconductor memory having redundant word lines involves multiple selection of a real word line and a redundant word line (see, for example Japanese Patent Application Laid-Open Nos. 2000-260199 and H11-203894). In this type of testing method, the redundant word line is selected by decoding external addresses received at address terminals.

However, the external addresses are supplied to an address decoder configured to select a real word line. Accordingly, when selecting the redundant word line by using the external addresses, an unintended real word line may be selected unless the address decoder to select the real word lines is stopped. Therefore, if extra stress is applied to the real word lines resultantly, reliabilities of the semiconductor memory may possibly be deteriorated.

SUMMARY

According to a first aspect of the embodiment, a semiconductor memory has a memory cell array having a plurality of real word lines, a plurality of redundant word lines, a plurality of bit lines crossing with the real and redundant word lines, a plurality of memory cells provided at crossing section of the real and redundant word lines and the bit lines; and a row selection circuit for selecting the real word line or the redundant word line in accordance with a row address being supplied; wherein the row selection circuit selects the real word line or the redundant word line at an ordinary operation, and multi-selects the redundant word lines at a first test mode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates an example of the memory cell array 28 illustrated in FIG. 2;

FIG. 7 illustrates an example of the logic of the address conversion circuit ACNV illustrated in FIG. 6;

FIG. 8 illustrates an example of the logic of the hit signal generation circuit HITGEN illustrated in FIG. 6;

DESCRIPTION OF EMBODIMENT(S)

The following will describe embodiments with reference to the drawings. A signal line through which signals are transmitted is given the same symbol as a signal name. The signal having "Z" at its end is based on the positive logic. The signal having "/" at its top or "X" at its end is based on the negative logic. In the figures, a double square mark denotes an external terminal. The external terminal is, for example, a pad in a semiconductor chip or a lead wire of a package housing the semiconductor chip. The signal supplied via the external terminal is given the same symbol as the terminal name.

Figure 1:
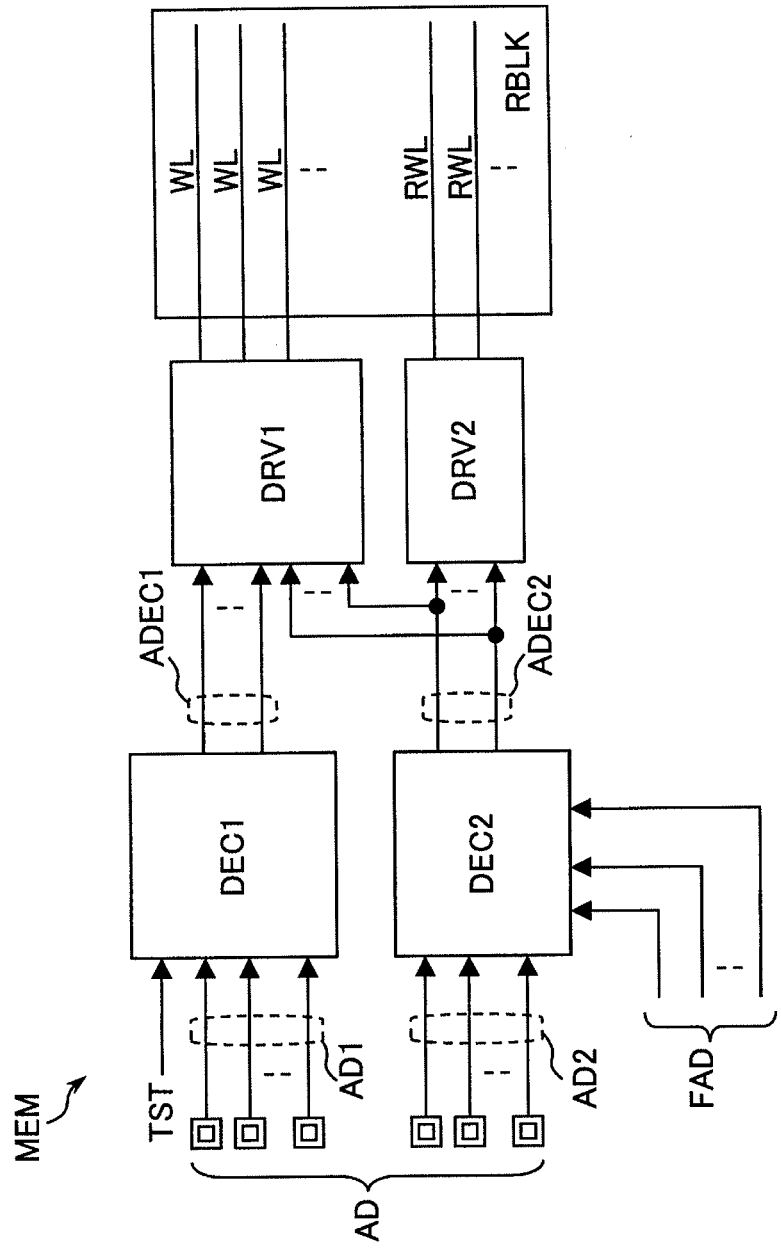
FIG. 1 illustrates an example of a semiconductor memory MEM in one embodiment. The semiconductor memory MEM has decoders DEC1 and DEC2, drivers DRV1 and DRV2, and a memory block RBLK.

FIG. 1 illustrates an example of a semiconductor memory MEM in one embodiment. The semiconductor memory MEM has decoders DEC1 and DEC2, drivers DRV1 and DRV2, and a memory block RBLK. The memory block RBLK has a plurality of real word lines WL and a plurality of redundant word lines RWL.

The decoder DEC1 decodes some addresses AD1 of external addresses AD received at address terminals AD and outputs a decoded signal ADEC1. The decoder DEC2 decodes, in the normal operation mode, other some addresses AD2 of the external addresses AD or redundant addresses FAD denoting a redundant word line RWL which are used for fault recovery, especially decodes the second address AD2 in a test mode, and outputs a decoded signal ADEC2. The driver DRV1 selects a real word line WL in accordance with the decoded signals ADEC1 and ADEC2. The driver DRV2 selects a redundant word line RWL in accordance with the decoded signal ADEC2.

In the present embodiment, when having received a test signal TST denoting a test mode, the decoder DEC1 prohibits decoding to stop outputting the decoded signal ADEC1. The test signal TST may well be generated inside the semiconductor memory MEM in response to entry of the test mode or supplied from an outside of the semiconductor memory MEM. If the output of the decoded signal ADEC1 is stopped, the driver DRV1 stops selecting the real word line WL to keep all of the real word lines WL in a deselected state.

The decoder DEC2 generates the decoded signal ADEC2 if it receives the addresses AD2 or the redundant addresses FAD irrespective of the test signal TST and outputs it to the driver DRV2. Further, the decoder DEC2 decodes second addresses AD2 in the test mode in which decoding by the decoder DEC1 are prohibited. In such a manner, it is possible to select an arbitrary redundant word line RWL without selecting a real word line WL, by using external addresses AD received at the address terminals AD. As a result, in a test applying stress on the redundant word lines RWL, it is possible to prohibit extra stress from being applied to the real word lines WL, thereby preventing deteriorations in reliability of the semiconductor memory MEM. Further, the decoder DEC2 and the driver DRV2 consecutively select redundant word lines RWL corresponding to the external second address AD2 so as to multi-select a plurality of redundant word lines in a test mode. In this test mode, the real word lines are not selected.

Figure 2:
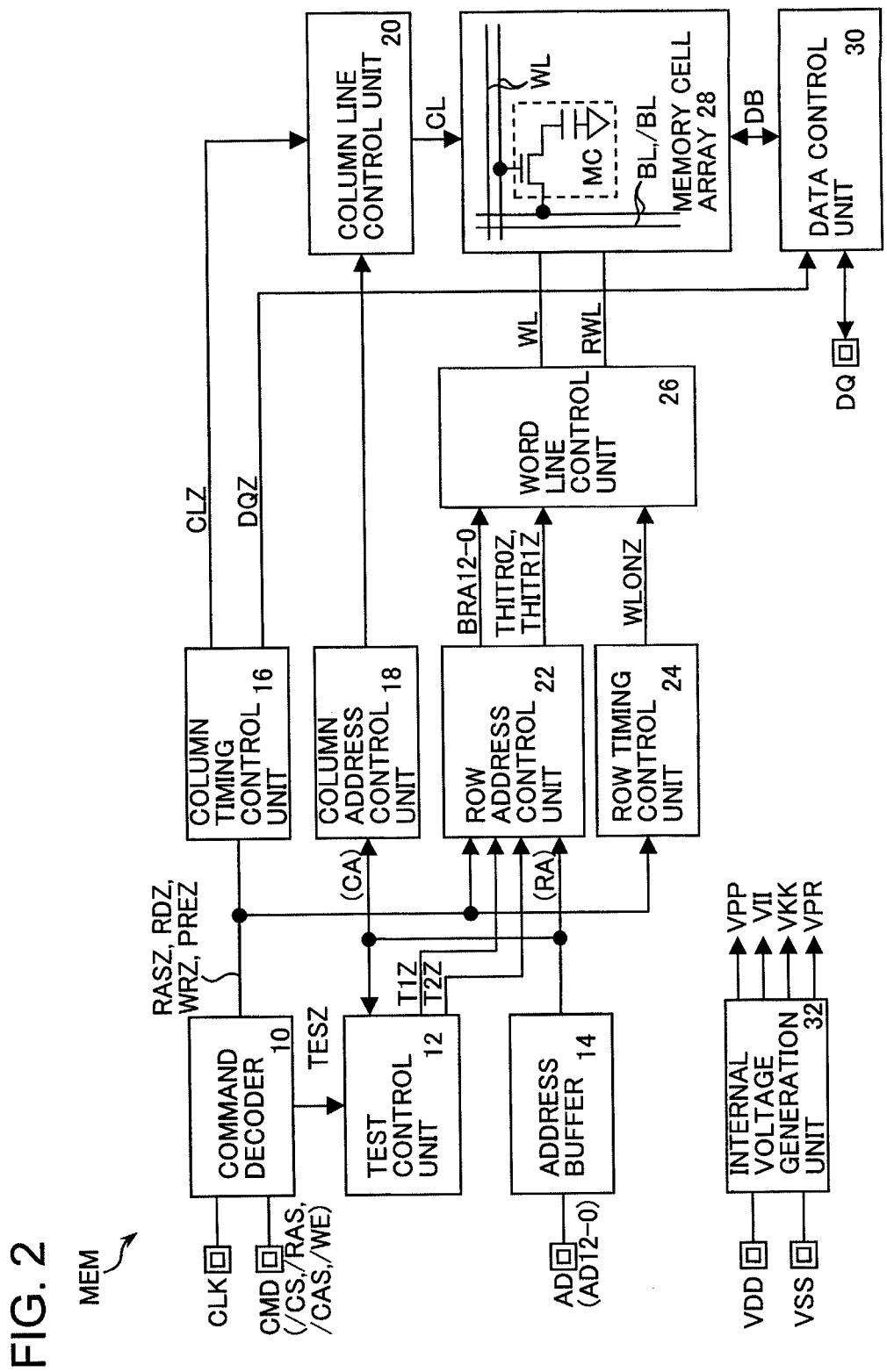
FIG. 2 illustrates an example of a semiconductor memory MEM in another embodiment.

FIG. 2 illustrates an example of a semiconductor memory MEM in another embodiment. In those embodiments, identical reference numerals are given to identical components, and detailed description thereof will not be repeated here. For example, a semiconductor memory MEM is a dynamic random access memory (DRAM). The semiconductor memory MEM receives a clock signal CLK to operate in synchronization with the clock signal CLK; however, it may operate asynchronously without receiving the clock signal CLK. The semiconductor memory MEM may be designed as a package-sealed semiconductor memory device or as a memory macro (IP) mounted in a system LSI etc.

The semiconductor memory MEM has a command decoder 10, a test control unit 12, an address buffer 14, a column timing control unit 16, a column address control unit 18, a column line control unit 20, a row address control unit 22, a row timing control unit 24, a word line control unit 26, a memory cell array 28, a data control unit 30, and an internal voltage generation unit 32. For example, the semiconductor memory MEM has a circuit configured to control refresh operations for memory cells MC besides those illustrated in FIG. 2. The following will omit description of the refresh operations.

The command decoder 10 receives a command signal CMD in synchronization with the clock signal CLK to decode received the command signals CMD. For example, the command signals CMD include a chip select signal /CS, a row address strobe signal /RAS, a command address strobe signal /CAS, and a write enable signal /WE. The command decoder 10 outputs a command signals RASZ, RDZ, WRZ, PREZ, etc. to perform memory cell array access operations in accordance with decoding results. Further, the command decoder 10 outputs a test command signal TESZ when it has decoded a test command to test the semiconductor memory MEM.

The command signal RASZ is generated to select a real word line WL and a redundant word line RWL in order to activate the memory cell array 28. The read command signal RDZ is generated to perform read operations to read data from the memory cell array 28. The write command signal WRZ is generated to perform write operations to write data to the memory cell array 28. The precharge command signal PREZ is generated to deselect a real word line WL and a redundant word line RWL in order to deactivate the memory cell array 28.

The test control unit 12 activates or deactivates a test mode signal T1Z or T2Z in accordance with a value of an external address AD received along with a test command signal TESZ.

The semiconductor memory MEM activates the test mode signal T1Z to enter a first test mode in which a plurality of redundant word lines RWL is multi-selected. In the first test mode, data is written to the memory cells MC connected to the plurality of redundant word lines RWL or those redundant word lines RWL are supplied with a high voltage simultaneously, in order to conduct a stress test. If the test mode signal T1Z is deactivated, the semiconductor memory MEM exits the first test mode to return to a normal operation mode in which data is written to or read from the memory cells MC.

Figure 6:
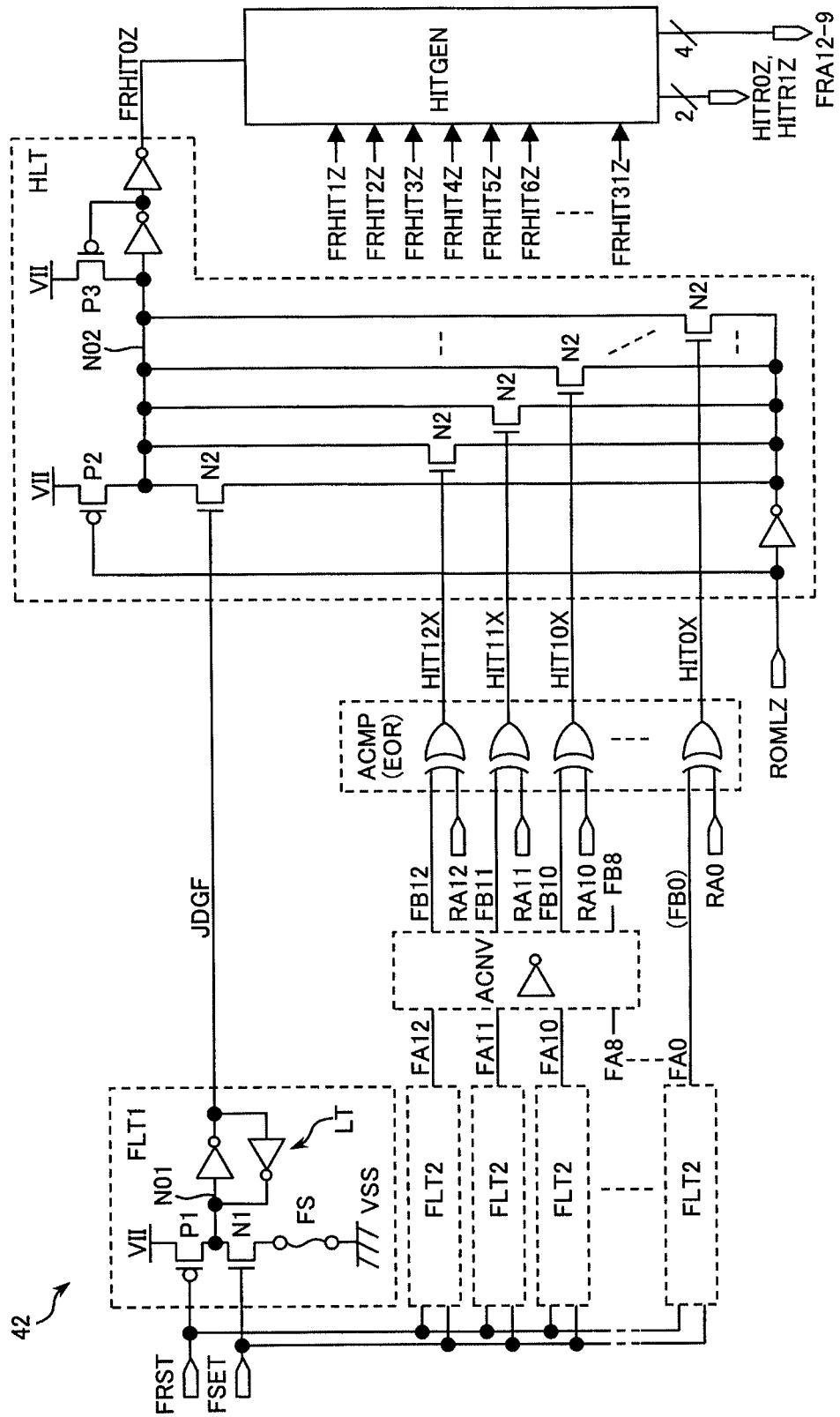
FIG. 6 illustrates an example of the redundancy decision circuit 42 illustrated in FIG. 5.

If the test mode signal T2Z is activated, the semiconductor memory MEM enter a second test mode in which one of the redundant word lines RWL is selected and data is written to or read from the memory cells connected to the redundant word lines RWL. In the second test mode, an arbitrary redundant word line RWL is selected irrespective of whether fuse latch circuits FLT1 and FLT2 illustrated in FIG. 6 are programmed. If the test mode signal T2Z is deactivated, the semiconductor memory MEM exits the second test mode to return to the normal operation mode.

The test control unit 12 may be formed as a mode register to set the operation mode of the semiconductor memory MEM. In this case, the test command TESZ is supplied to the test control unit as a command signal configured to set the value of the mode register. Furthermore, in place of the test control unit 12, external terminals (test terminals) receiving the respective test mode signals T1Z and T2Z may be provided to the semiconductor memory MEM.

The address buffer 14 receives the external address signals AD (AS12-AD0) via the address terminals AD to output the received external address signals AD to the test control unit 12, the column address control unit 18, and the row address control unit 22. The column address control unit 18 is supplied with a column address signal CA received at the address terminal AD. The row address control unit 22 is supplied with a row address signal RA received at the address terminal AD. The semiconductor memory MEM of the present embodiment has employed the address multiplex type by which the row address signal RA and the column address signal CA are received at the same address terminal AD at different timings. The number of bits of the external address signal AD is not limited to 13. For example, the number of the bits of the external address signal AD only needs to be determined in accordance with the number of the real word lines WL.

The column timing control unit 16 outputs a timing signal CLZ which determines operations of the column line control unit 20 in accordance with the command signals RDZ and WRZ. In response to the command signal RDZ, the column timing control unit 16 outputs a timing signal DQZ to provide the data terminal DQ with a read data signal to be read from the memory cell array 28 to the data control unit 30. Further, in response to the command signal WRZ, the column timing control unit 16 outputs the timing signal DQZ to provide the memory cell array 28 with a write data signal to be supplied to the data control unit 30 via the data terminal DQ.

The column address control unit 18 latches the external address signal AD from the address buffer 14 in synchronization with the command signals RDZ and WRZ to output the latched external address signal AD to the column line control unit 20 as the column address signal CA. The column line control unit 20 decodes the column address signal CA from the column address control unit 18 to output any one of column selection signals CL which is denoted by the column address signal CA in synchronization with the timing signal CLZ.

The row address control unit 22 latches the external address signal AD from the address buffer 14 in synchronization with the timing signal such as a row address latch signal from the command decoder 10. In the normal operation mode (where the T1Z and the T2Z are at the low level), if the latched external address signal AD does not denote a faulty real word line WL, the row address control unit 22 supplies the word line control unit 26 with the latched external address signal AD as a row address signal BRA (BRA12-0).

Figure 12:
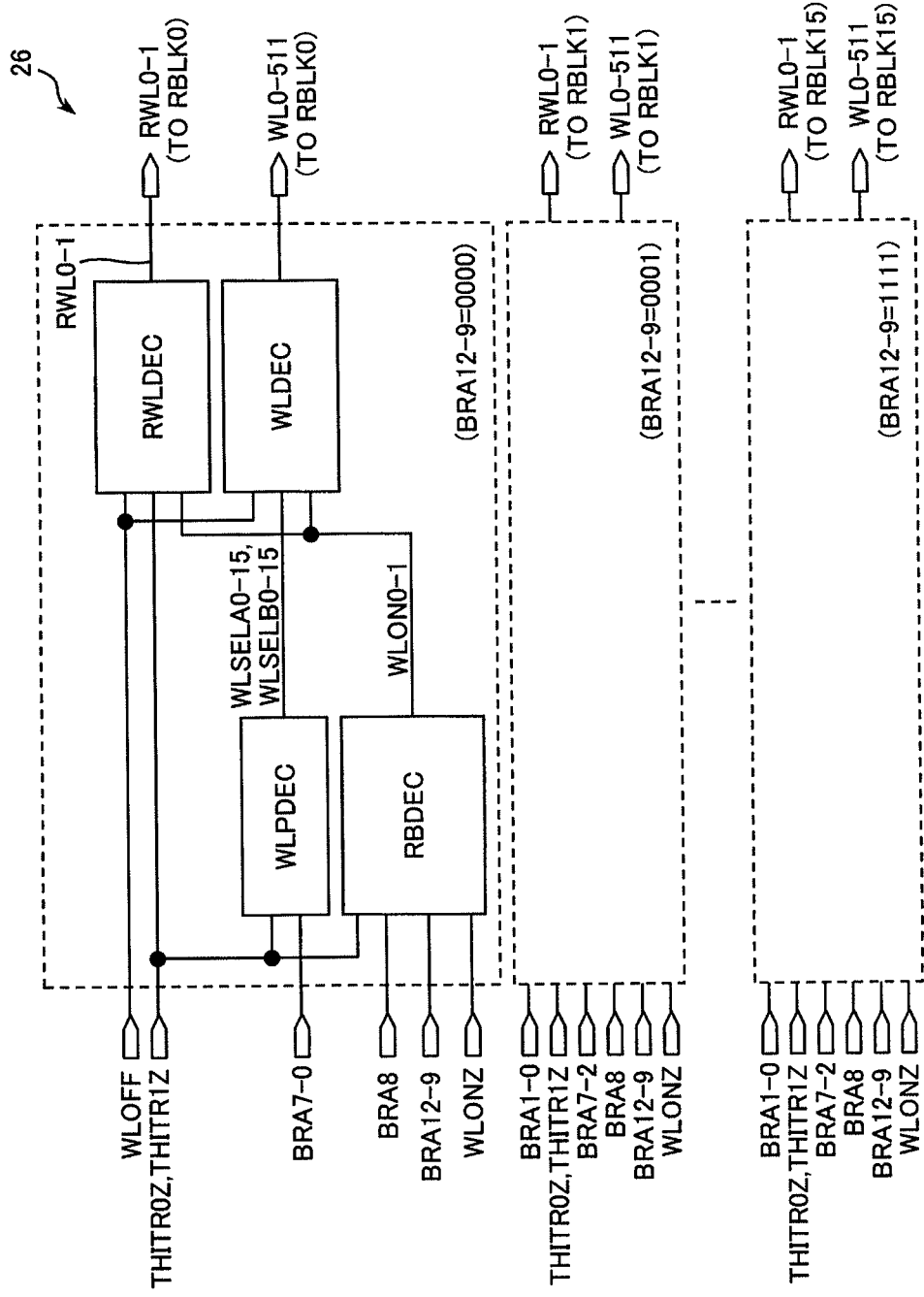
FIG. 12 illustrates an example of the word line control unit 26 illustrated in FIG. 2.

In the normal operation mode, if the latched external address signal AD denotes a faulty real word line WL, the row address control unit 22 supplies the word line control unit 26 with the row address signal BRA which denotes the redundant word line RWL to be selected in place of the faulty read word line WL. When outputting the row address signal BRA denoting the redundant word line RWL, the row address control unit 22 activates hit signals THITRZ (THITR0Z or THITR1Z) which express the selection of redundant word line RWL. In the first test mode (where the T1Z is at the high level), the row address control unit 22 forcedly activates the hit signals THITR0Z and THITR1Z to prohibit the selection of real word lines WL by the row pre-decoder WLPDEC in the word line control unit 26 as illustrated in FIG. 12, and supply the word line control unit 26 with the row address signal RA to be supplied via the address terminal AD as the row address signal BRA to make the word line control unit 26 select redundant word line RWL. Detailed operations in the test mode will be described later.

Figure 4:
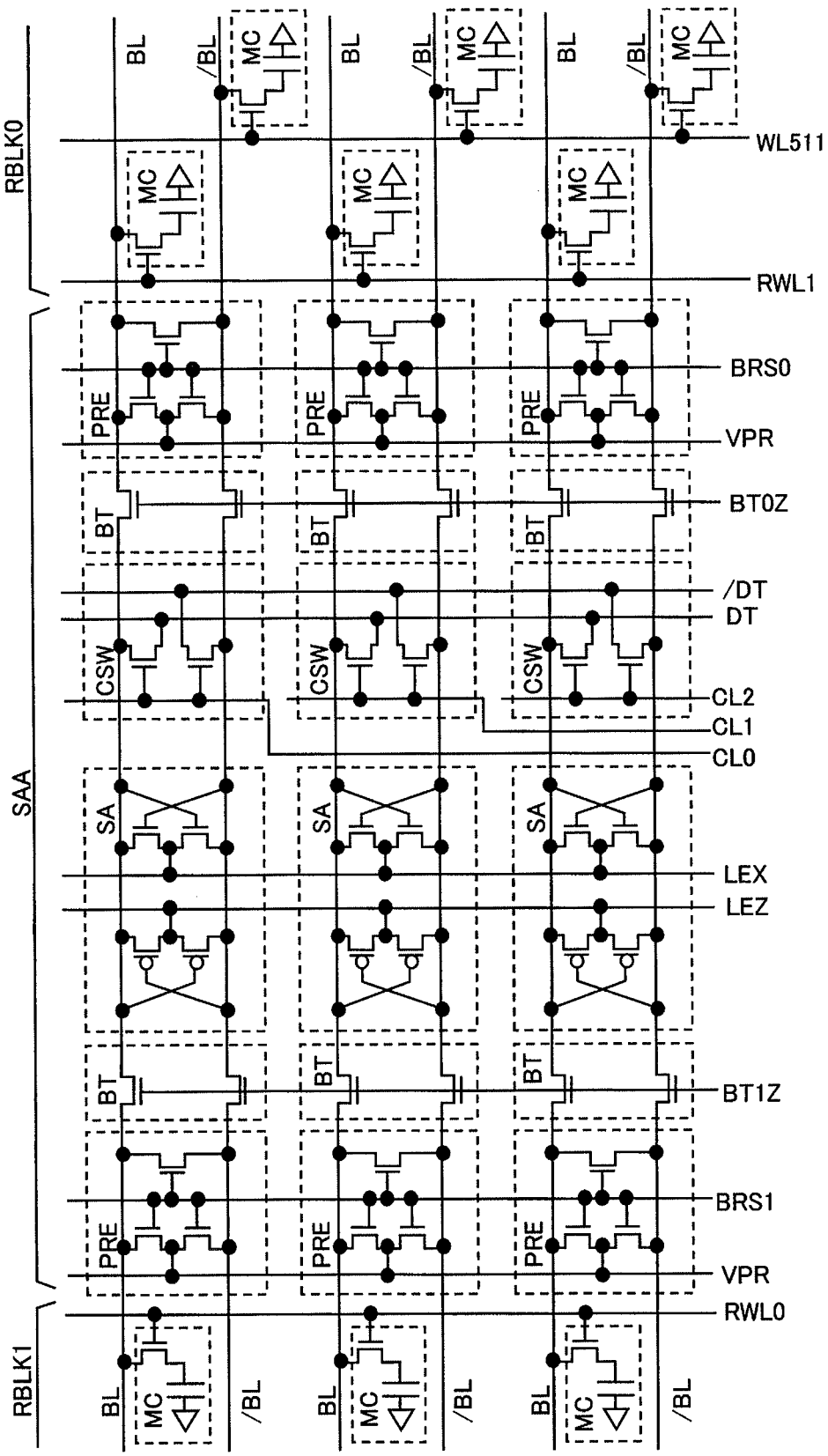
FIG. 4 illustrates an example of the sense-amplifier SAA illustrated in FIG. 3.

The row timing control unit 24 activates the timing signal WLONZ in response to the command signal RASZ and deactivates the timing signal WLONZ in response to the command signal PREZ. The timing signal WLONZ is used to determine a period in which the real word lines WL and the redundant word lines RWL are activated. Also, the row timing control unit 24 generates the timing signal configured to operate a sense-amplifier SA and a pre-charge circuit PRE (FIG. 4). The word line control unit 26 receives the row address signal BRA as well as the hit signals THIR0Z and THITR1Z to activate the real word line WL or the redundant word line RWL in response to the timing signal WLONZ.

The memory cell array 28 has a plurality of dynamic memory cells MC arranged in a matrix, a plurality of word lines WL (or RWL) connected to lines of the memory cells MC arranged horizontally in the figure and a complementary bit line pair BL and /BL connected to the lines of the memory cells MC arranged vertically in the figure. The memory cell MC has a capacitor configured to hold data as charge and a transfer transistor configured to connect one end of the capacitor to the bit line BL (or /BL). The other end of the capacitor is connected to a reference voltage line. A reference voltage which is supplied to the reference voltage line is the same as, for example, a pre-charge voltage VPR and generated by the internal voltage generation circuit 32.

In read operations, in response to the timing signal DQZ, the data control unit 30 provides the data terminal DQ with the read data signal supplied from the memory cell array 28. In write operations, in response to the command signal WRZ, the data control unit 30 provides the memory cell array 28 with the write data signal supplied via the data terminal DQ.

The internal voltage generation unit 32 generates voltages VPP, VII, VPR, and VKK based on a power supply voltage VDD and a ground voltage VSS. The voltage VPP is generated by raising the power supply voltage VDD and used as a high-level voltage etc. for the real word lines WL and the redundant word lines RWL. The voltage VII is supplied as an internal power supply voltage to internal circuits other than circuits connected to the external terminal. The voltage VPR is used as a pre-charge voltage etc. for the bit lines BL and /BL. The voltage VKK is negative in value and used as a low-level voltage (reset voltage) etc. for the real word lines WL and the redundant word lines RWL.

FIG. 3 illustrates an example of the memory cell array 28 illustrated in FIG. 2. For example, the memory cell array 28 has 16 memory blocks RBLK (RBLK0-RBLK15) each of which has the 512 real word lines WL0-WL511 and the two redundant word lines RWL0 and RWL1, and a sense-amplifier SAA disposed between a pair of the memory blocks RBLK. The memory blocks RBLK0-RBLK15 are each selected by high-order four bits BRA12-BRA9 of the row address signal BRA. For example, the redundant word lines RWL0, RWL1 are formed respectively on the two sides of a group of the real word lines WL0-WL511. And the two redundant word lines RWL0, RWL1 are selected by the hit signal THITR0Z/1Z.

FIG. 4 illustrates an example of the sense-amplifier SAA illustrated in FIG. 3. FIG. 4 illustrates a portion of the sense-amplifier area SAA corresponding to one of the data terminals DQ. The sense-amplifier area SAA has the pre-charge circuit PRE and the bit line switch BT corresponding to each of the memory blocks RBLK0-1 and the sense-amplifier SA and the column switch CSW which are shared in use by the memory blocks RBLK0-1.

The pre-charge control signal BRS (BRS0 or BRS1) is supplied to a plurality of the pre-charge circuits PRE corresponding to the memory block RBLK0 or RBLK1. Each of the pre-charge control signals BRS0-1 is set to the high level when the corresponding memory block RBLK is inactive and to the low level when the corresponding memory block RBLK is active.

The switch control signal BTZ (BT0Z or BT1Z) is supplied to a plurality of bit line switches BT corresponding to the memory block RBLK0 or RBLK1. The switch control signal BTZ is set to the low level when the corresponding memory block RBLK is inactive and to the high level when the corresponding memory block RBLK is active. The bit line switch BT has an nMOS transistor disposed between the bit lines BL and /BL and the sense-amplifier SA, and is turned on when the corresponding switch control signal BTZ is at the high level.

Sense-amplifier activation signals LEZ and LEX are supplied commonly to the plurality of sense-amplifiers SA in the sense-amplifier area SAA. The sense-amplifier activation signals LEZ and LEX are set to the pre-charge voltage VPR when the corresponding memory block RBLK are inactive and activated respectively to the high level and the low level when the corresponding memory block RBLK are active.

The column selection signals CL (CL0, CL1, and CL2) are output to the column switch CSW respectively. The column selection signals CL0-CL2 are set to the high level in accordance with the column addresses CA in read operations and write operations. The sense-amplifier area SAA is of the same configuration as a typical DRAM and, therefore, its detailed description will be omitted.

For each memory block RBLK, the pre-charge signal BRS, the switch control signal BTZ, and the sense-amplifier activation signals LEZ and LEX are selected in accordance with the row address signals BRA12-BRA9 and activated or deactivated in response to the timing signals from the row timing control unit 24. For example, the memory blocks RBLK are active over a period from a time when the command signal RASZ is output to a time when the command signal PREZ is output.

Figure 5:
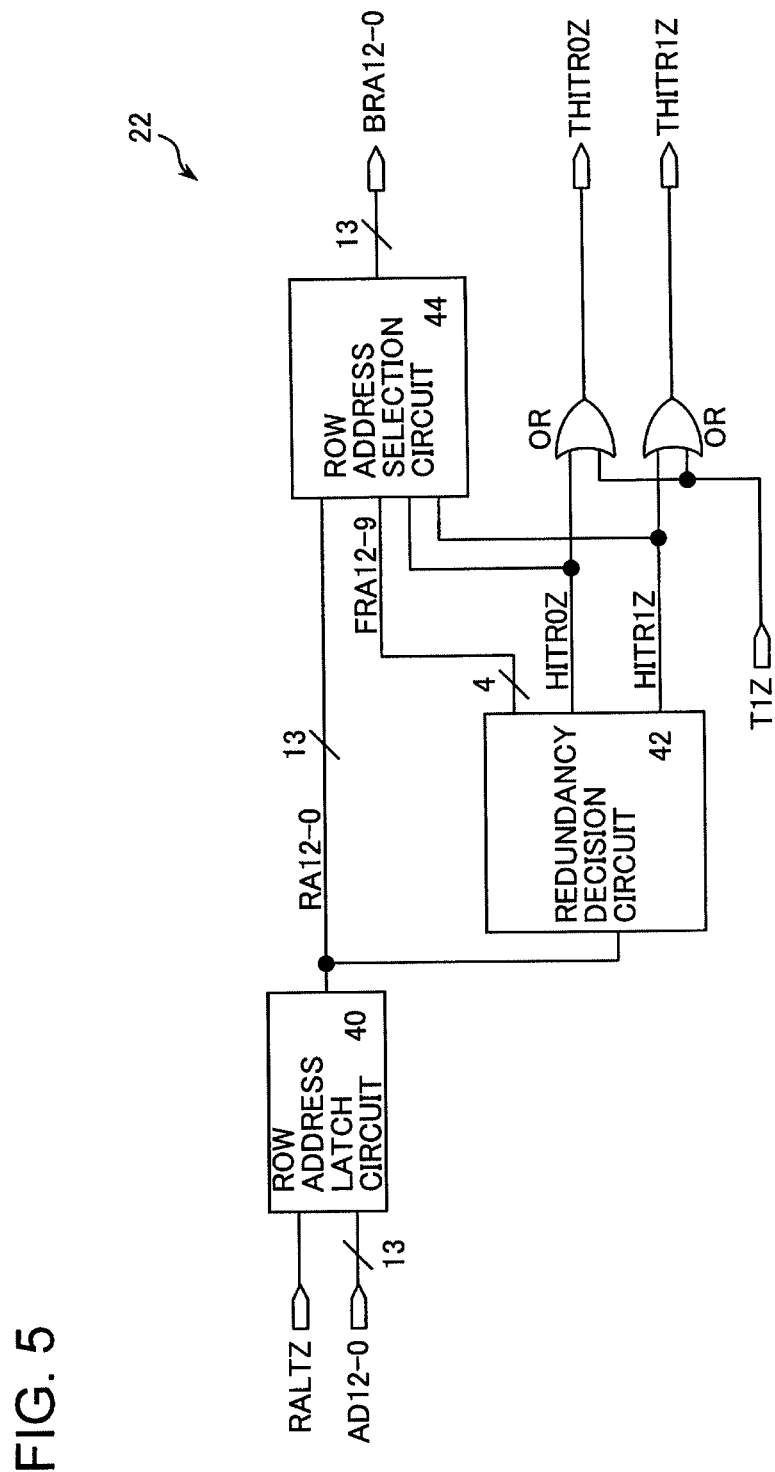
FIG. 5 illustrates an example of the row address control unit 22 illustrated in FIG. 2.

FIG. 5 illustrates an example of the row address control unit 22 illustrated in FIG. 2. The row address control unit 22 has a row address latch circuit 40, a redundancy decision circuit 42, a row address selection circuit 44, and two OR circuits. The row address latch circuit 40 latches the external address signals AD12-AD0 in synchronization with a row address latch signal RALTZ and outputs the latched signals as row address signals RA (RA12-RA0). For example, the row address latch signal RALTZ is output from the command decoder 10 in synchronization with row address strobe signal /RAS.

If the row address signal RA agrees with a fault address denoting a faulty real word line WL, the redundancy decision circuit 42 outputs a row address signals FRA (FRA12-FRA9) denoting the memory block RBLK containing the redundant word line RWL to be selected. The row address signal FRA is one example of a redundant address which denotes a redundant word line which is used for fault recovery. Further, if the row address signal RA agrees with the fault address, the redundancy decision circuit 42 outputs the hit signal HITRZ (HITR0Z or HTR1Z) denoting the redundant word line RWL to be selected (RWL0 or RWL1). The faulty addresses are stored in the redundancy decision circuit 42 beforehand.

If the hit signal HIT0Z or HITR1Z is not output (is in the low-level deactivated state), the row address selection circuit 44 selects the row address signals RA12-RA0 and outputs them as the row address signals BRA12-BRA0. If the hit signal HIT0Z or HITR1Z is output (is in the high-level activated state), the row address selection circuit 44 selects the row address signals FRA12-FRA9 and outputs them as the row address signals BRA12-BRA9, so that a redundant word line in one of the 16 row memory blocks is selected by FRA12-FRA9. Further, if the hit signal HITR0Z or HITR1Z is output, the row address selection circuit 44 outputs the high-level row address signals BRA8-BRA0.

In the normal operation mode (where T1Z is at the low level), the OR circuits each activates the hit signal THITR0Z (or THITR1Z) when the hit signal HITR0Z (or HITR1Z) is in the activated state. In the first test mode (where T1Z is at the high level (active)), the hit signals HITR0Z, HITR1Z are both inactive (L-level) due to a pre-program state of the faculty addresses so that the row address RA12-RA9 are selected and output by the row address selection circuit 44 and the redundant word line RWL is selected by RA12-RA9. In the first test mode, the two OR circuits, which is an example of test circuit, forcibly activate the hit signals THITR0Z and THITR1Z. The OR circuits are each an example of the test circuit which outputs the hit signal THITR0Z (THITR1Z) when it receives the hit signal HITR0Z (HITR1Z) or the first test mode signal T1Z. The hit signals TH1TR0Z and THITR1Z are each an example of the test signal which prohibits decoding by the row pre-decoder WLPDEC illustrated in FIG. 12. When the row pre-decoder WLPDEC is prohibited from decoding, all the real world lines WL are non-selected.

FIG. 6 illustrates an example of the redundancy decision circuit 42 illustrated in FIG. 5. The address decision circuit 42 is provided at each of the 16 row memory blocks RBLK. The redundancy decision circuit 42 has one fuse latch circuit FLT1, 13 fuse latch circuit FLT2, an address conversion circuit ACNV, an address comparison circuit ACMP, a hit signal latch circuit HLT, and a hit signal generation circuit HITGEN. The fuse latch circuits FLT1 and FLT2, the address conversion circuit ACNV, the address comparison circuit ACMP and the hit signal latch circuit HLT which are illustrated in FIG. 6 are formed respectively corresponding to the redundant word lines RWL0 and RWL1 in the memory blocks RBLK0-RBLK15.

The fuse latch circuits FLT1 and FLT2 are identical with each other. The fuse latch circuits FLT1 and FLT2 each have a pMOS transistor P1 and an nMOS transistor N1 disposed in series between the internal power supply line VII and the ground line VSS, a fuse FS, and a latch LT. An input node N01 of the latch LT is connected to the drains of the respective pMOS transistor P1 and nMOS transistor N1. For example, the fuse FS blows if it is irradiated with laser light or supplied with a predetermined value of current or more.

The gate of the pMOS transistor P1 is supplied with a reset signal FRST which changes from the low level to the high level upon power-on of the semiconductor memory MEM. The reset signal FRST is kept at the high level when the semiconductor memory MEM is in the power on-state and set to the low level in the second test mode (where T2Z is at the high level). The gate of the nMOS transistor N1 is supplied with a set signal FSET which changes to the high level temporarily upon power-on of the semiconductor memory MEM. The reset signal FRST and a set signal FSET are supplied commonly to all of the fuse latches FLT1 and FLT2 corresponding to the redundant word lines RWL0 and RWL1 in the memory blocks RBLK0-RBLK15.

The input node N01 of the latch LT is charged in a period when the reset signal FRST in the power on-state is at the low level. If then the fuse FS is not in the blown state after the reset signal FRST changes to the high level in the power on-state, the fuse FS's input node N01 is discharged by high-level pulses of the set signal FSET such that the latch LT may output a high level. If the fuse FS is in the blown state, the node N01 is not discharged even by high-level pulses of the set signal FSET such that the latch LT may output a low level.

The fuse FS of the fuse latch circuit FLT1 blows if the corresponding redundant word line RWL is used for fault recovery. If the fuse FS is blown, the relevant fuse latch FLT1 outputs a low-level judge signal JDGF upon power-on.

The fuse FS of the fuse latch circuit FLT2 has a value programmed in it which is obtained by performing logical operations on the values of the row address signals RA12-RA0 denoting the real word line WL for fault recovery and the number of the corresponding redundant word line RWL. The fuse latch FLT2 outputs the row address signals FA12-FA0 based on the logic corresponding to the programmed state of the fuse FS. The row address signals FA8-FA0 are supplied to the address comparison circuit ACMP as the low-order bits of a faulty address denoting the faulty real word line WL. See FIG. 7 for the values of the row address signals RA12-RA0 denoting the real word line WL for faulty recovery, and specification for a fuse FS program.

In the second test mode, the fuse latches FLT1 and FLT2 each output a low level from the output of the latch LT irrespective of the programmed state of the fuse FS in a period when the fuse reset signal FRST is at the low level. Then, the address conversion circuit ACNV converts all low-level output FA12-8 into a row address of corresponding row memory blocks by each conversion logic explained below.

The address conversion circuit ACNV receives the row address signals FA12-FA8 from the fuse latch circuit FLT2 corresponding to the row address signals RA12-RA8. The address conversion circuit ACNV inverts the logic of the row address signals FA12-FA8 in accordance with a predetermined rule and outputs them as the row address signals FB12-FB8. The row address signals FB12-FB8 denote the high-order bits of a faulty address denoting the faulty real word line WL. In the second test mode, in a case where the low level is output from all of the fuse circuits FLT1 and FLT2, the address conversion circuit ACNV is necessary in order to select an arbitrary redundant word line RWL. Operations in the second test mode will be outlined in FIG. 10.

The address comparison circuit ACMP receives the row address signals FB12-FB8 from the address conversion circuit ACNV and the row address signals FA7-FA0 from the fuse latch circuit FLT2. The address comparison circuit ACMP has 13 EOR circuits that receive one of the row address signals FB12-FB8 as well as FA7-FA0 and the corresponding one of the row address signals RA12-RA01. The EOR circuits each output the low-level hit signal HITX (HIT12X-HIT0Z) if bit values received at the input terminals agree and the high-level hit signal HITX if bit values received at the input terminals disagree.

The hit signal latch circuit HLT has pMOS transistors P2 and P3 and a group of a plurality of nMOS transistors N2. When a timing signal ROMLZ is at the low level, the pMOS transistor P2 is turned on to charge the node N02. The nMOS transistor N2 receives each of the judge signal JDGF and the hit signal HITX at its gate. If at least one of the judge signal JDGF and the hit signal HITX changes to the high level in a period when the timing signal ROMLZ is at the high level, the nMOS transistor N2 is turned on to discharge the node N02. The pMOS transistor P3 functions as a latch which keeps the high level of the node N02.

The timing signal ROMLZ is generated by the row timing control unit 24 illustrated in, for example, FIG. 2 and activated in the active period in response to the command signal RASZ. If the outputs of the judge signal JDGF and the EOR circuits are all at the low level, the hit signal latch circuit HLT keeps the node N02 at the high level and outputs the high-level hit signal FRHITZ (any one of FRHIT0Z-FRHIT31Z). That is, if the fuse FS of the fuse latch circuit FLT1 blows and the value of the row address signals FB12-FB8 and FA7-FA0 agrees with that of the row address signals RA12-RA0, the corresponding hit signal FRHITZ is kept at the high level (activated state). The high-level hit signal FRHITZ is output when using the redundant word line RWL in place of the faulty word line WL.

If the output of the judge signal JDGF or either one of the EOR circuits is at the high level, the hit signal latch circuit HLT changes the node N02 to the low level to change the hit signal FRHITZ (any one of FRHIT0Z-FRHIT31Z) to the low level. That is, if the real word lines are not replaced with the redundant word line and the fuse FS of the fuse latch circuit FLT1 is not blown, or the fuse FS is blown due to replacement of real word line with redundant word line but the value of the row address signals FB12-FB8 and FA7-FA0 disagrees with that of the row address signals RA12-RA0, the corresponding hit signal FRHITZ changes to the low level.

In response to the activation of the hit signals FRHIT0Z-FRHIT31Z, the hit signal generation circuit HITGEN activates the corresponding hit signal HITRZ (HITR0Z or HITR1Z) and outputs the row address signals FRA12-FRA9 denoting the redundant word line RWL to be used. If the hit signals FRHIT0Z-FRHIT31Z all change to the low level, the hit signal generation circuit HITGEN does not activate the hit signal HITR0Z or HITR1Z and outputs the row address signals FRA12-FRA9 having a predetermined value (for example, high level). Operations of the hit signal generation circuit HITGEN are illustrated in FIG. 8.

FIG. 7 illustrates an example of the logic of the address conversion circuit ACNV illustrated in FIG. 6. The address conversion circuit ACNV is formed corresponding to each of the redundant word lines RWL0-RWL1 of the memory block RBLK. The bits having the symbol of the inverter illustrated in FIG. 7 illustrate that the logic is inverted if the row address signals FA12-FA8 are converted into the row address signals FB12-FB8 respectively. The bits not having the symbol of the inverter illustrate that the row address signals FA12-FA8 are output as the row address signals FB12-FB8 respectively.

For example, it is assumed that the real word line WL0 in the memory block RBLK0 assigned the row address signals RA12-RA0 having value "0000h (h denotes hexadecimal)" is replaced with the redundant word line RWL1 in the memory block RBLK1.

FIG. 7 illustrates that the row address signals FA9-FA8 are converted by the address conversion circuit ACNV to generate the row address signals FB9-FB8. Accordingly, the row addresses FA9-FA8 having value "11" are output from the fuse latch circuit FLT2 in order to permit the address comparison circuit ACMP illustrated in FIG. 6 to detect that the RA9-RA8 having value "00" agrees with the row address signals FB9-FB8 having value "00". Therefore, the fuse FS of the fuse latch circuit FLT2 which outputs the row address signals FA9-FA8 does not blow, whereas the fuse FS of the fuse latch circuit FLT2 which outputs the row address signals FA12-FA9 and FA7-FA0 blows.

In this case, the row address signals FA12-FA8 take on a value of "00011" and the row address signals FB12-FB8 take on a value of "00000". Therefore, when the row address signals RA12-RA0 supplied from the outside of the semiconductor memory MEM are "0000h", the corresponding hit signal FRHITZ is activated.

Figure 10:
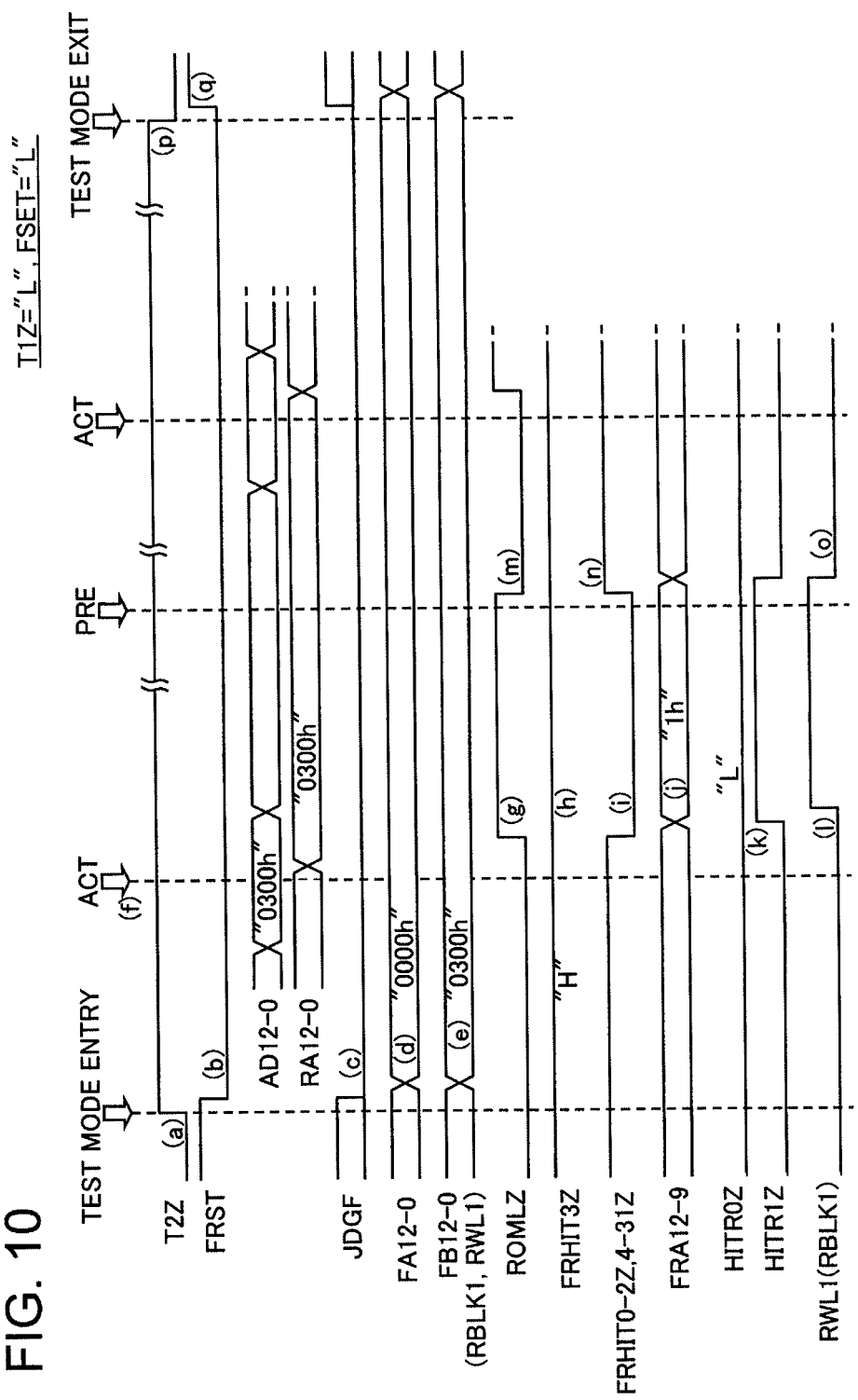
FIG. 10 illustrates an example of operations of the redundancy decision circuit 42 illustrated in FIG. 6 in the second test mode.

In the second test mode, as described in FIG. 10, the fuse latch circuits FLT1 and FLT2 all output the low level due to FSET=L. In this case, for example, the address conversion circuit ACNV in the redundancy decision circuit 42 corresponding to the redundant word line RWL1 in the memory block RBLK1 outputs the low address signals FB12-FB8 having value "00011(=03h)". The address conversion circuit ACNV in the redundancy decision circuit 42 corresponding to the redundant word line RWL0 in the memory block RBLK15 outputs the row address signals FB12-FB8 having value "11110 (=1Eh)". Therefore, in the second test mode, when the row address signals RA12-RA0 having value "0300h" are supplied from the outside of the semiconductor memory MEM, the row addresses FB12-FB8 and RA12-RA8 are agreed in the row memory block RBLK3, and the hit signal FRHIT3Z corresponding to the redundant word line RWL1 in the memory block RBLK1 is activated. Or, in the second test mode, if the row address signals RA12-RA8 having value "1E00h" is supplied from the outside of the semiconductor memory MEM, the row addresses FB12-FB8 and RA12-RA8 are agreed in the row memory block RBLK15, and the hit signal FRHIT30Z corresponding to the redundant word line RWL0 in the memory block RBLK15 is activated.

FIG. 8 illustrates an example of the logic of the hit signal generation circuit HITGEN illustrated in FIG. 6. If the even-numbered hit signal FRHITZ is of logic 1, the hit signal generation circuit HITGEN sets the hit signal HITR0Z to logic 1, and if the odd-numbered hit signal FRHITZ is of logic 1, sets the hit signal HITR1Z to logic 1. The even-numbered hit signal FRHITZ denotes the redundant word line RWL0 in the corresponding memory block RBLK. The odd-numbered hit signal FRHITZ denotes the redundant word line RWL1 in the corresponding memory block RBLK.

Further, the hit signal generation circuit HITGEN encodes the activated hit signal RFHITZ (any one of FRHIT0Z-FRHIT31Z). Then, the hit signal generation circuit HITGEN generates the row address signals FRA12-FRA9 denoting the memory block RBLK containing the redundant word line RWL corresponding to the activated hit signal RFHITZ.

Figure 9:
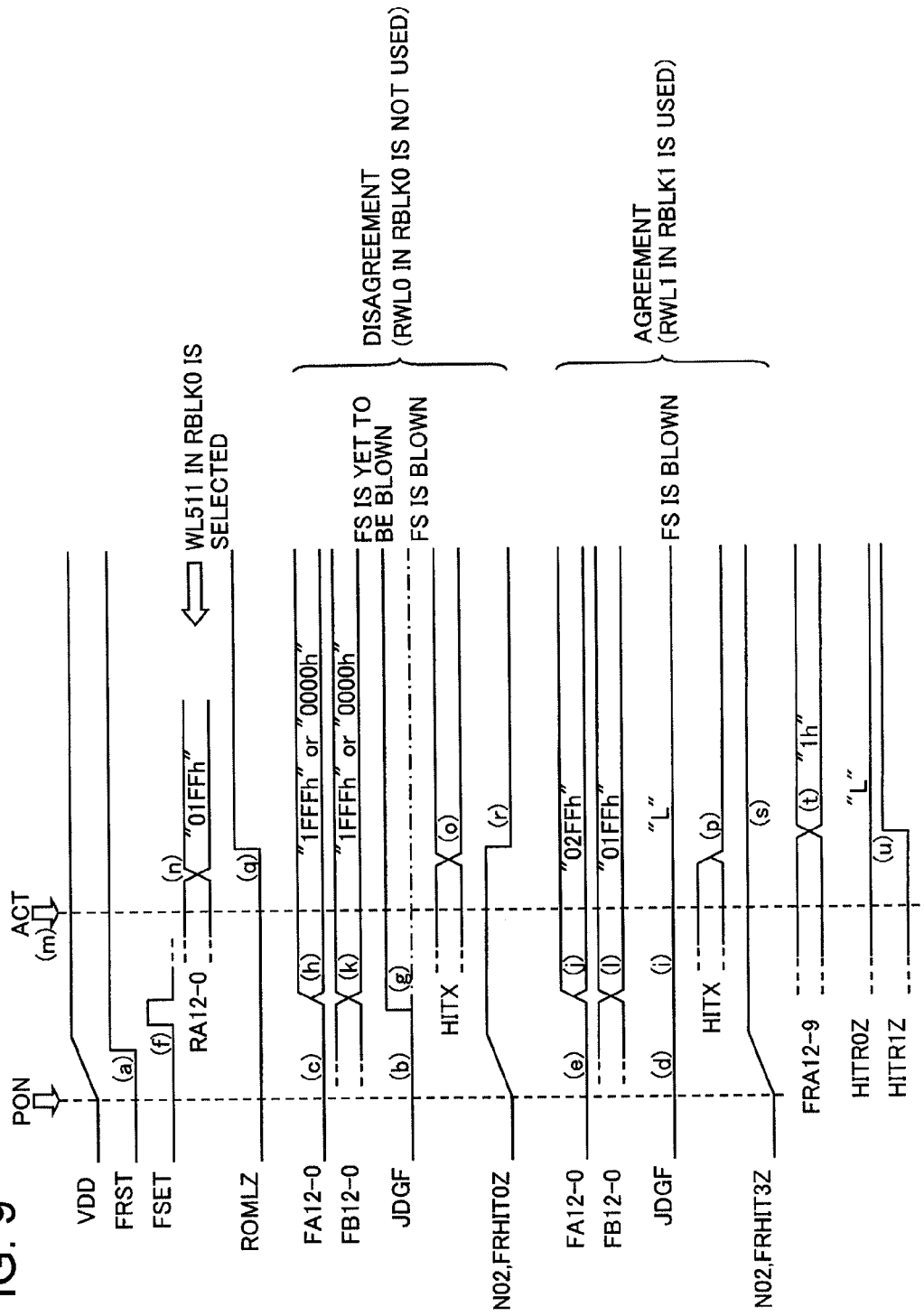
FIG. 9 illustrates an example of operations of the redundancy decision circuit 42 in FIG. 6 in the normal operation mode.

FIG. 9 illustrates an example of operations of the redundancy decision circuit 42 in FIG. 6 in the normal operation mode. The example illustrates the operations of the redundancy decision circuit 42 corresponding to the redundant word line RWL0 in the memory block RBLK0 and the redundant word line RWL1 in the memory block RBLK1.

For example, it is assumed as follows. The redundant word line RWL0 in the memory block RBLK0 is not used, so the corresponding judge signal JDGF is at the high level. In this case, the corresponding redundancy decision circuit 42 is not programmed, to output the row address signals FA12-FA0 and FB12-FB0 having value "1FFFh". The redundant word line RWL1 in the memory block RBLK1 is used to recover the real word line WL511 in the memory block RBLK0.

First, the power supply voltage VDD is supplied to the semiconductor memory MEM (PON) and rises to a predetermined voltage, whereupon the reset signal FRST changes from the low level to the high level ((a) of FIG. 9). In a period when the reset signal FRST is at the low level, the node N01 in each of the fuse latch circuits FLT1 and FLT2 is set to the high level, such that those fuse latch circuits FLT1 and FLT2 set the judge signal JDGF and the low address signals FA12-FA0 to the low level ((b), (c), (d), (e) of FIG. 9).

Subsequently, the set signal FSET is set to the high level temporarily to determine the logical levels of the judge signal JDGF signal and the row address signals FA12-FA0 in accordance with the state of the fuse FS ((f), (g), (h), (i), (j) of FIG. 9). For example, the reset signal FRST and the set signal FSET are generated by a power-on reset circuit formed in the semiconductor memory MEM.

In this case, to recover the real word line WL0 in the memory block RBLK0, the row address signals FA12-FA0 to be programmed into the fuse latch circuit FLT2 corresponding to the redundant word line RWL0 in the memory block RBLK0 take on value "0000h". To recover the real word line WL511 in the memory block RBLK0, the row address signals FA12-FA0 to be programmed into the fuse latch circuit FLT2 corresponding to the redundant word line RWL1 in the memory block RBLK1 take on value "02FFh". The address conversion circuit ACNV converts the row address signals FA12-FA8 into the row address signals FB12-FB8 in accordance with the rules illustrated in FIG. 7 ((k), (l) of FIG. 9). As a result of the address conversion, the row address signals FB12-FB0 of the redundancy decision circuit 42 corresponding to the redundant word line RWL1 in the memory block RBLK1 take on value "01FFh".

Next, along with the activate command ACT, the external address signal AD is supplied to the semiconductor memory MEM ((m) of FIG. 9). The row address latch circuit 40 illustrated in FIG. 5 latches the external address signal AD and outputs it as the row address signals RA12-RA0 (01FFh) to the redundancy decision circuit 42 ((n) of FIG. 9). In the redundancy decision circuit 42 where at least any one of the bits of the row address signals RA12-FA0 and that of the row address signals FB12-FB0 disagree, any one of the bits of the hit signal HITX takes on the high level ((o) of FIG. 9). In the redundancy decision circuit 42 where the row address signals RA12-FA0 and the row address signals FB12-FB0 agree, all of the hit signals HITX change to the low level ((p) of FIG. 9).

Next, the timing signal ROMLZ is activated ((q) of FIG. 9). The hit signal latch circuit HLT having received the hit signal HITX containing the high-level bit sets the hit signal FRHIT0Z to the low level ((r) of FIG. 9). The hit signal latch circuit HLT having received the hit signal HITX with all the bits set to the low level and the low-level judge signal JDGF keeps the hit signal FRHIT3Z at the high level ((s) of FIG. 9). The other hit signals HITR1Z and HITR2Z-31Z not illustrated in FIG. 9 find address disagreement as a result of comparison by the corresponding address comparison circuit ACMP or the high-level judge signal JDGF and, therefore, change to the low level.

The hit signal generation circuit HITGEN corresponding to the redundant word line RWL1 in the memory block RBLK1 receives the high-level hit signal FRHIT3Z and outputs the row address signals FRA12-FRA9 (1h) and the low-level hit signal HITR0Z as well as the high-level hit signal HITR1Z in accordance with the rules illustrated in FIG. 8 ((t), (u) of FIG. 9). Accordingly, the redundant word line RWL1 in the memory block RBLK1 is selected in place of the real word line WL511 (01FFh) in the memory block RBLK0.

FIG. 10 illustrates an example of operations of the redundancy decision circuit 42 illustrated in FIG. 6 in the second test mode. The same operations as those in FIG. 9 will not be described in detail. In the second test mode, irrespective of whether the fuse latch circuits FLT1 and FLT2 illustrated in FIG. 6 are programmed, an arbitrary redundant word line RWL is selected and used to perform data read/write operations.

First, along with the test command to be supplied to the command terminal CMD, the address signal denoting the entry of the second test mode is supplied to the semiconductor memory MEM such that the test control unit 12 illustrated in FIG. 2 may activate the test mode signal T2Z ((a) of FIG. 10). In response to the activation of the test mode signal T2Z, the state of the semiconductor memory MEM shifts from the normal operation mode to the second test mode.

In response to the activation of the test mode signal T2Z, the row address control unit 22 sets the reset signal FRST to the low level ((b) of FIG. 10). Accordingly, the redundancy decision circuit 42 corresponding to all of the redundant word lines RWL0-RWL1 in all of the memory blocks RBLK0-RBLK15 outputs the low-level judge signal JDGF and the low-level row address signals FA12-FA0 ((c), (d) of FIG. 10). For example, the address conversion circuit ACNV in the redundancy decision circuit 42 corresponding to the redundant word line RWL1 in the memory block RBLK1 receives the row address signals FA12-FA0 (0000h) and outputs the row address signals FB12-FB0 (0300h) ((e) of FIG. 10).

Next, along with the activate command ACT, the external address signal AD is supplied to the semiconductor memory MEM ((f) of FIG. 10). Subsequently, as in the case of FIG. 9, the address comparison circuit ACMP compares the bits of the row address signals RA12-RA0 and FB12-FB0. In response to the timing signal ROMLZ, the hit signal latch circuit HLT receives a result of the comparison by the address comparison circuit ACMP ((g) of FIG. 10). The hit signal circuit HLT corresponding to the redundant word line RWL1 in the memory block RBLK1 keeps the activated state of the hit signal FRHIT3Z based on the comparison result (agreement) from the address comparison circuit ACMP ((h) of FIG. 10). Based on the comparison result (disagreement) from the address comparison circuit ACMP, the other hit signal latch circuits HLT change the hit signals FRHIT0Z-2Z and 4Z-31Z to the low level ((i) of FIG. 10).

In response to the activation of the hit signal FRHIT3Z, the hit signal generation circuit HITGEN outputs the row address signals FRA12-FR9 (1h) and the low-level hit signal HITR0Z as well as the high-level hit signal HITR1Z in accordance with the rules illustrated in FIG. 8 ((j), (k) of FIG. 10). Accordingly, the redundant word line RWL1 in the memory block RBLK1 is activated to the high level to enable operating write and read operations ((l) of FIG. 10). In such a manner, in the second test mode in accordance with the external address signals AD12-AD0 supplied from the outside of the semiconductor memory MEM, it is possible to perform the test by selecting an arbitrary redundant word line RWL in an arbitrary memory block RBLK.

After the redundant word line RWL1 in the memory block RBLK1 is tested, the pre-charge command PRE is supplied to the command terminal CMD. The timing signal ROMLZ and the hit signals HITR0Z-HITR1Z are deactivated and the hit signals FRHIT0Z-FRHIT31Z are set to the high level ((m), (n) of FIG. 10). In response to the supply of the pre-charge command PRE, the redundant word line RWL1 in the memory block RBLK1 is deactivated ((o) of FIG. 10).

Subsequently, for example, to select another redundant word line RWL and perform a test, the activate command ACT is supplied to the semiconductor memory MEM. After the test is performed in the second test mode, along with the test command, the address signal denoting the exit of the second test mode is supplied to the semiconductor memory MEM. The test control unit 12 deactivates the test mode signal T2Z ((p) of FIG. 10). In response to the reactivation of the test mode signal T2Z, the row address control unit 22 sets the reset signal FRST to the high level ((q) of FIG. 10). Then, the state of the semiconductor memory MEM returns from the second test mode to the normal operation mode.

Figure 11:
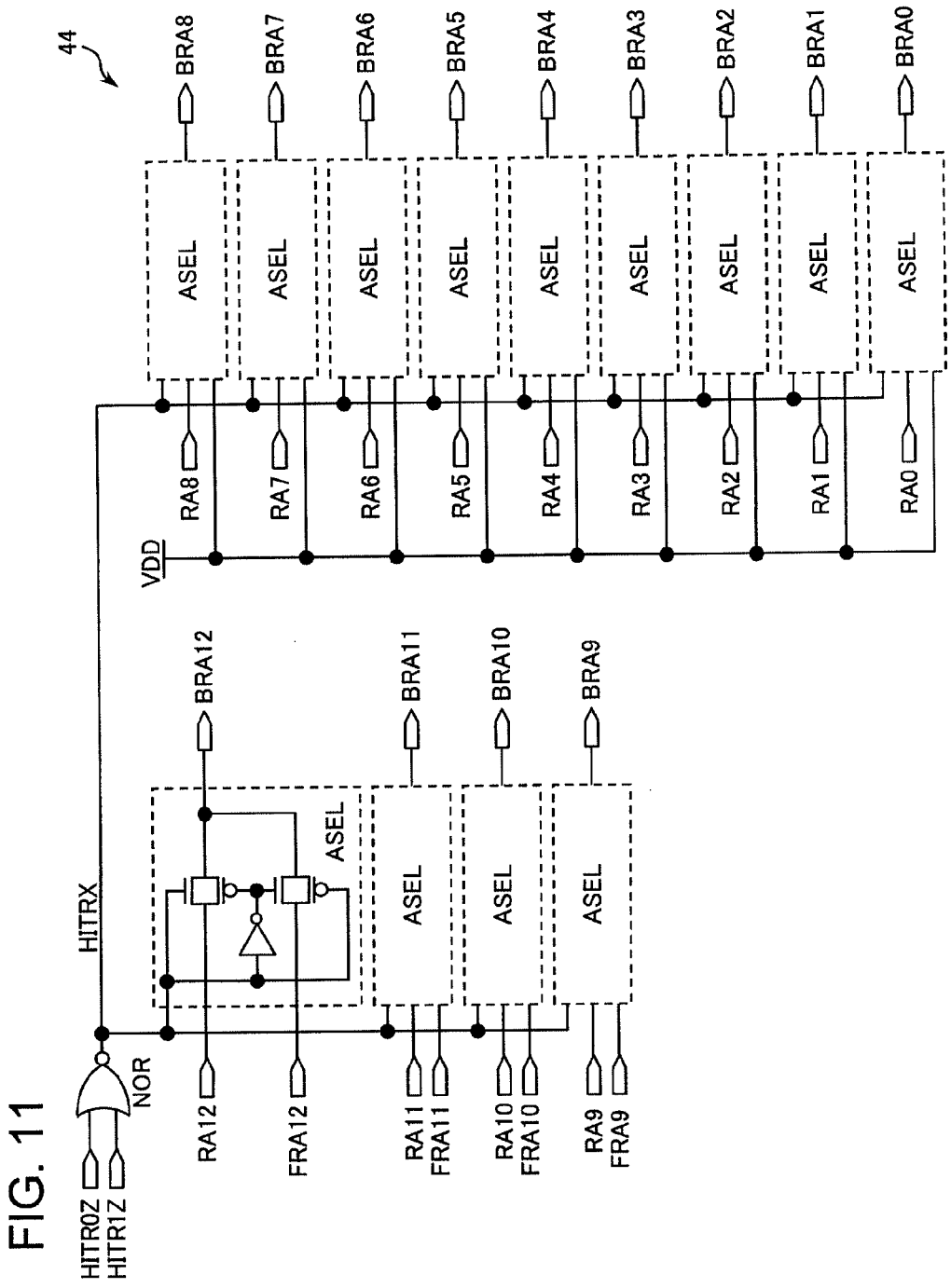
FIG. 11 illustrates an example of the row address selection circuit 44 illustrated in FIG. 5.

FIG. 11 illustrates an example of the row address selection circuit 44 illustrated in FIG. 5. The row address selection circuit 44 has an NOR circuit and address selectors ASEL each of which outputs the row address signals BRA (BRA12-BRA0). The NOR circuit outputs the low-level hit signal HITRX when it is supplied with the high-level hit signal HITR0Z or HITR0Z from the hit signal generation circuit HITGEN illustrated in FIG. 6. The address selectors ASEL are all identical to one another and each have a CMOS transfer gate which is turned on or off according to the logical level of the hit signal HITRX. The CMOS transfer gate is formed by interconnecting the respective sources and drains of its pMOS transistor and nMOS transistor.

If the hit signal HITRX is at the high level, the address selector ASEL corresponding to the row address signal RA12-RA9 outputs the row address signal RA12-RA9 as the row address signal BRA12-BRA9. Further, if the hit signal HITRX is at the low level due to the hit signals HITR0Z/1Z being L-level, the address selector ASEL corresponding to the row address signal RA12-RA9 outputs the row address signal RA12-RA9 as the row address signal BRA12-BRA9. In such a manner, if the hit signal HITRX is deactivated to the high level due to either hit signal HITR0Z/1Z being H-level, the row address signal RA12-RA9 supplied from the outside of the semiconductor memory MEM is output as the row address signal BRA12-BRA9. If the hit signal HITRX is activated to the low level, the row address signal RA12-RA9 are output as the row address signal BRA12-BRA9 denoting the redundant word line RWL.

If the hit signal HITRX is at the high level, the address selector ASEL corresponding to the row address signal RA8-RA0 outputs the row address signal RA8-RA0 as the row address signal BRA8-BRA0. Further, if the hit signal HITRX is at the low level, the address selector ASEL corresponding to the row address signal RA8-RA0 outputs the high-level row address signal BRA8-BRA0. In such a manner, if the hit signal HITRX is deactivated to the high level, the row address signal RA8-RA0 supplied from the outside of the semiconductor memory MEM is output as the row address signal BRA8-BRA0. If the hit signal HITRX is activated to the low level, the row address signal RA8-RA0 having an invalid value is output. If the hit signal HITRX is activated to the low level, the address selector ASEL might as well output the row address signal BRA8-BRA0 having a level other than the high level.

FIG. 12 illustrates an example of the word line control unit 26 illustrated in FIG. 2. The word line control unit 26 has the row pre-decoder WLPDEC, a row block decoder RBDEC, a redundant word line decoder RWLDEC, and a real word line decoder WLDEC corresponding to each of the memory blocks RBLK0-RBLK15.

Figure 14:
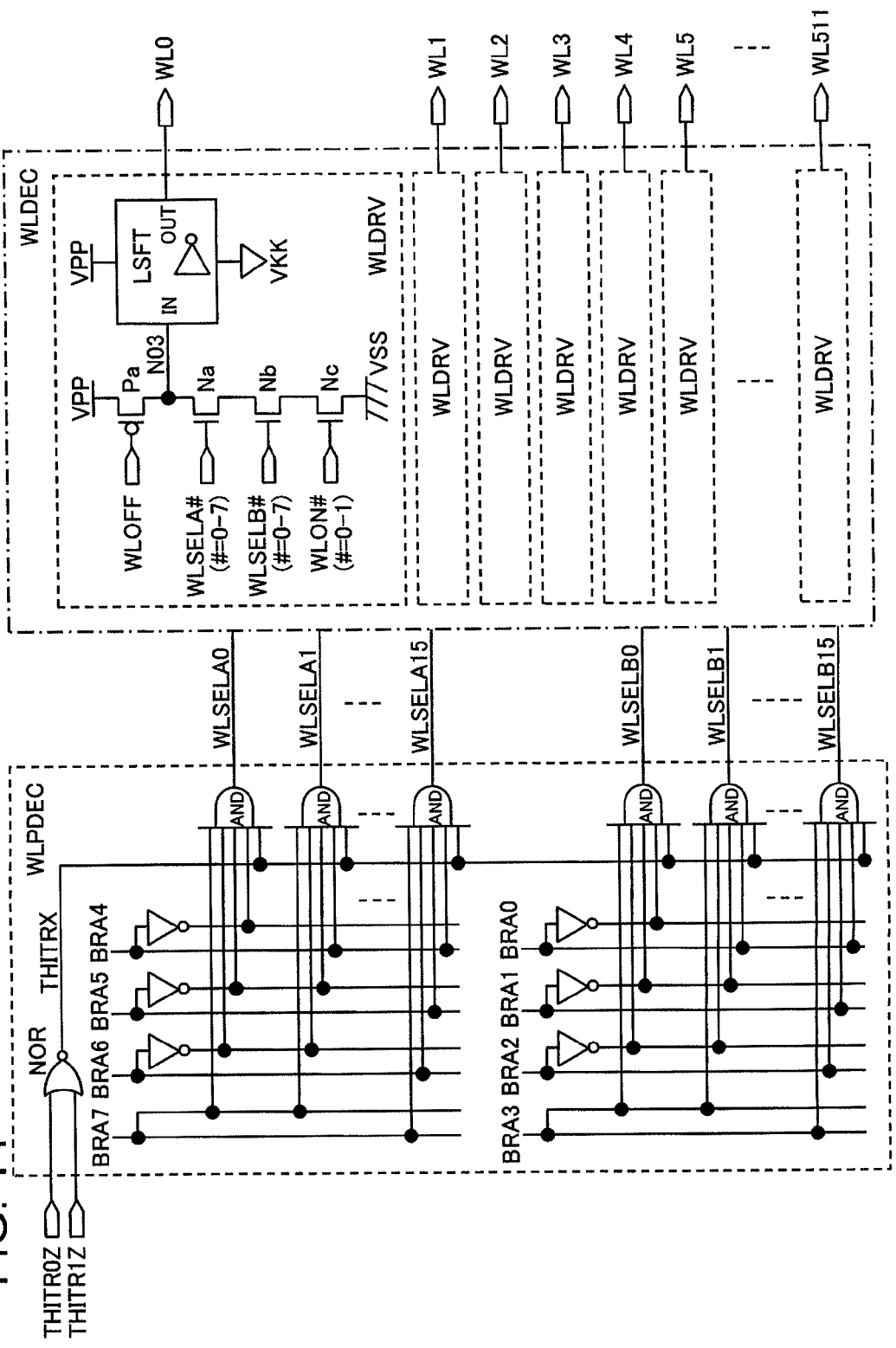
FIG. 14 illustrates an example of the row pre-decoder WLPDEC and the real word line decoder WLDEC which are illustrated in FIG. 12.

The row pre-decoder WLPDEC activates any one of the decode signals WLSELA (WLSELA0-WLSELA15) corresponding to the row address signal BRA7-BRA4 if the hit signals THITR0Z and THITR1Z are both at the low level. Further, the row pre-decoder WLPDEC activates any one of the decode signals WLSELB (WLSELB0-WLSELB15) corresponding to the row address signal BRA3-BRA0 if the hit signals THITR0Z and THITR1Z are both at the low level. If the hit signal THITR0Z or THITR1Z is at the high level, the row pre-decoder WLPDEC prohibits decoding and deactivates all of the decode signals WLSELA and WLSELB to the low level. An example of the row pre-decoder WLPDEC is illustrated in FIG. 14.

The row block decoder RBDEC for each of the memory blocks RBLK0-RBLK15 activates at least one of the decode signals WLON (WLON0, WLON1) to the high level if the row address signal BRA12-BRA9 denotes the corresponding memory block RBLK. If the row address signal BRA12-BRA9 does not denote the corresponding memory block RBLK, each row block decoder RBDEC deactivates both of the decode signals WLON0 and WLON1 to the low level. An example of the row block decoder RBDEC is illustrated in FIG. 13.

Figure 15:
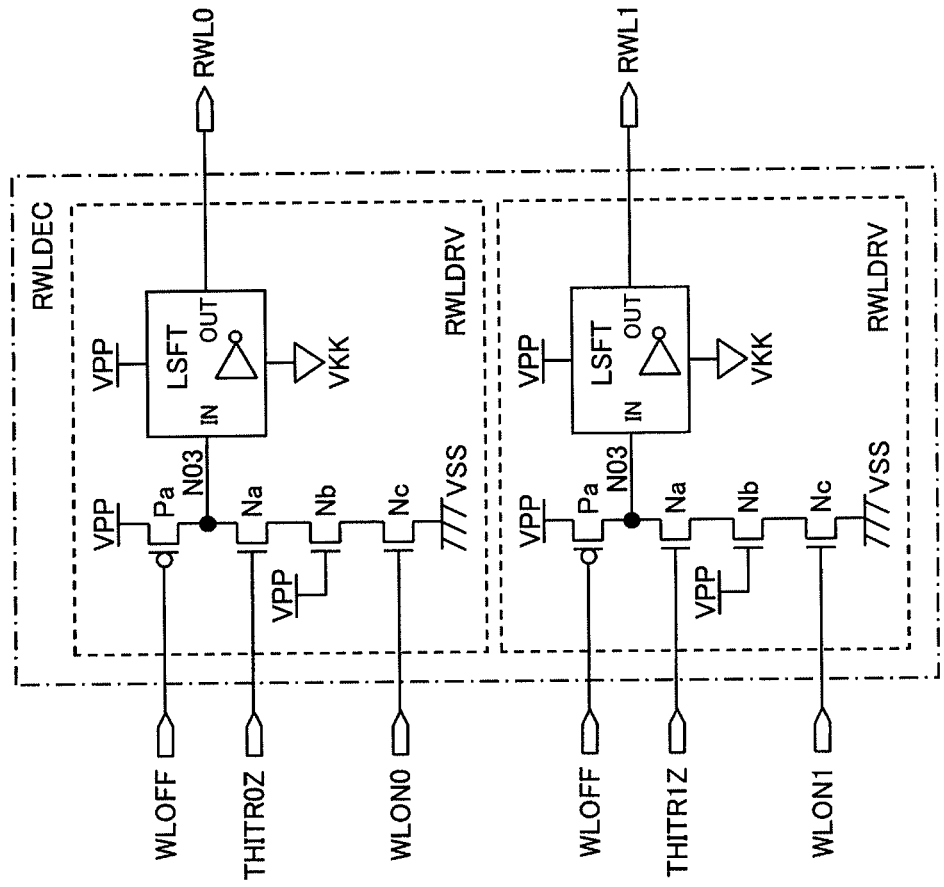
FIG. 15 illustrates an example of the redundant word line decoder RWLDEC illustrated in FIG. 12.

If the hit signal THITR0Z and the decode signal WLON0 are activated, the redundant word line decoder RWLDEC activates the redundant word line RWL0 to the high level in response to the timing signal WLOFF. If the hit signal THITR1Z and the decode signal WLON1 are activated, the redundant word line decoder RWLDEC activates the redundant word line RWL1 to the high level in response to the timing signal WLOFF. An example of the redundant word line decoder RWLDEC is illustrated in FIG. 15.

The real word line decoder WLDEC has 512 word line drivers WLDRV (FIG. 14) connected to the real word lines WL0-WL511 respectively. Each of the word line drivers WLDRV activates the corresponding real word line WL to the high level in response to the timing signal WLOFF if the corresponding decode signals WLSELA, WLSELB, and WLON are all activated to the high level. An example of the real word line decoder WLDEC is illustrated in FIG. 14.

Figure 13:
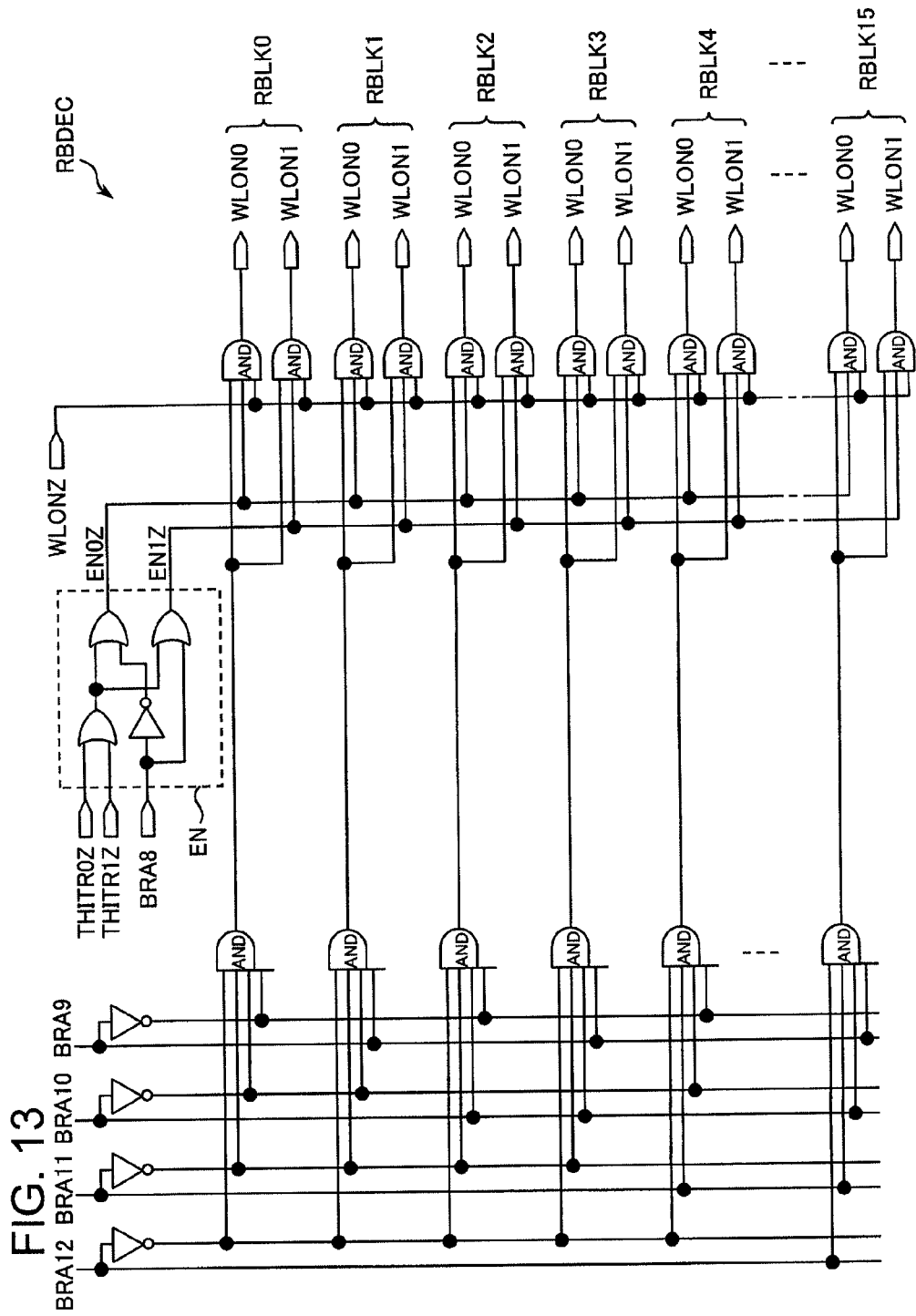
FIG. 13 illustrates an example of the row block decoder RBDEC illustrated in FIG. 12.

FIG. 13 illustrates an example of the row block decoder RBDEC illustrated in FIG. 12. FIG. 13 illustrates the row block decoders RBDEC corresponding to all the memory blocks RBLK0-RBLK15. The row block decoders RBDEC are identical with each other, and a description will be given of the row block decoder RBDEC corresponding to the memory block RBLK0.

The row block decoder RBDEC has a four-input AND circuit, two three-input AND circuits, and an enable circuit EN which outputs enable signals EN0Z and EN1Z. The enable circuit EN activates both of the enable signals EN0Z and EN1Z to the high level if the hit signal THIT0Z or THITR1Z is at the high level. If the hit signal THITR0Z and THITR1Z are both at the low level, the enable circuit EN activates either one of the enable signals EN0Z and EN1Z to the high level in accordance with the row address signal BRA8.

For example, if the row address signal BRA8 is at the low level, the enable signal EN0Z is activated, and if the row address signal BRA8 is at the high level, the enable signal EN1Z is activated. For example, the low-level row address signal BRA8 is used to select the low-order real word lines WL0-WL255 in each of the memory blocks RBLK0-RBLK15. The high-level row address signal BRA8 is used to select the high-order real word lines WL256-WL511 in each of the memory blocks RBLK0-RBLK15. The enable circuit EN may be commonly provided to all of the row block decoders RBDEC in the memory blocks RBLK0-RBLK15.

The four-input AND circuit outputs a high level to the two three-input AND circuits if the row address signals BRA12-BRA9 are all at the low level. The three-input AND circuit which outputs the decode signal WLON0 activates the decode signal WLON0 to the high level in response to the activation of the timing signal WLONZ if the four-input AND circuit's output and the enable signal EN0Z are both at the high level. The three-input AND circuit which outputs the decode signal WLON1 activates the decode signal WLON1 to the high level in response to the activation of the timing signal WLONZ if the four-input AND circuit's output and the enable signal EN1Z are both at the high level.

FIG. 14 illustrates an example of the row pre-decoder WLPDEC and the real word line decoder WLDEC which are illustrated in FIG. 12. FIG. 14 illustrates a circuit corresponding to one memory block RBLK.

The row pre-decoder WLPDEC has an NOR gate and AND circuits which output the decode signals WLSELA (WLSALA0-15) and WLSELB (WLSELB0-15) respectively. The NOR gate outputs the low-level hit signal THITRX if the hit signal THITR0Z or THITR1Z is at the high level. That is, the hit signal THITRX is set to the low level if any redundant word line RWL in memory blocks RBLK0-RBLK15 is used or in the first test mode.

If the hit signal is at the high level, each AND circuit outputs the decode signals WLSELA and WLSELB in accordance with values of the row address signals BRA7-BRA4 and BRA3-BRA0. If the hit signal THITRX is at the low level, all of the AND circuits set all of the decode signals WLSELA and WLSELB to the low level.

The word line driver WLDRV in the real word line decoder WLDEC has a pMOS transistor Pa and nMOS transistors Na, Nb, and Nc which are disposed in series between a boosted voltage line VPP and the ground line VSS and a level shifter LSFT. The pMOS transistor Pa is supplied with the timing signal WLOFF at its gate. The nMOS transistors Na, Nb, and Nc are supplied with the decode signals WLSELA, WLSELB, and WLON at their gates respectively. A node NO3 connected to the respective drains of the pMOS transistor Pa and the nMOS transistor Na is connected to an input IN of the level shifter LSFT. The node NO3 is set to the high level if the pMOS transistor Pa is turned on when the real word line WL is in the deselected state and, when the real word line WL is in the selected state, changes to the low level if the nMOS transistors Na, Nb, and Nc are turned on.

The level shifter LSFT sets the real word line WL to the high level VPP if the node NO3 is at the low level VSS and, if the node NO3 is at the high level VPP, sets the real word line WL to a low level VKK (negative voltage). An example of the level shifter LSFT is illustrated in FIG. 16.

FIG. 15 illustrates an example of the redundant word line decoder RWLDEC provided each of 16 row memory blocks RBLK0-15 as illustrated in FIG. 12. The redundant word line decoder RWLDEC has redundant word line drivers RWLDRV which correspond respectively to the redundant word lines RWL0 and RWL1. The redundant word line decoder RWLDRV is a circuit identical with the word line decoder WLDRV illustrated in FIG. 14.

The pMOS transistor Pa is supplied with the timing signal WLOFF at its gate. The nMOS transistors Na, Nb, and Nc of the redundant word line driver RWLDRV corresponding to the redundant word line RWL0 are supplied with the hit signal THITR0Z, the boosted voltage VPP, and the decode signal WLON0 at their gates respectively. The nMOS transistors Na, Nb, and Nc of the redundant word line driver RWLDRV corresponding to the redundant word line RWL1 are supplied with the hit signal THITR1Z, the boosted voltage VPP, and the decode signal WLON1 at their gates respectively. The redundant word line driver RWLDRV operates in much the same way as the word line driver WLDRV. That is, the redundant word lines RWL0 and RWL1 are set to the low level VKK if the pMOS transistor Pa is turned on and, if the nMOS transistors Na, Nb, and Nc are turned on, change to the high level VPP.

Figure 16:
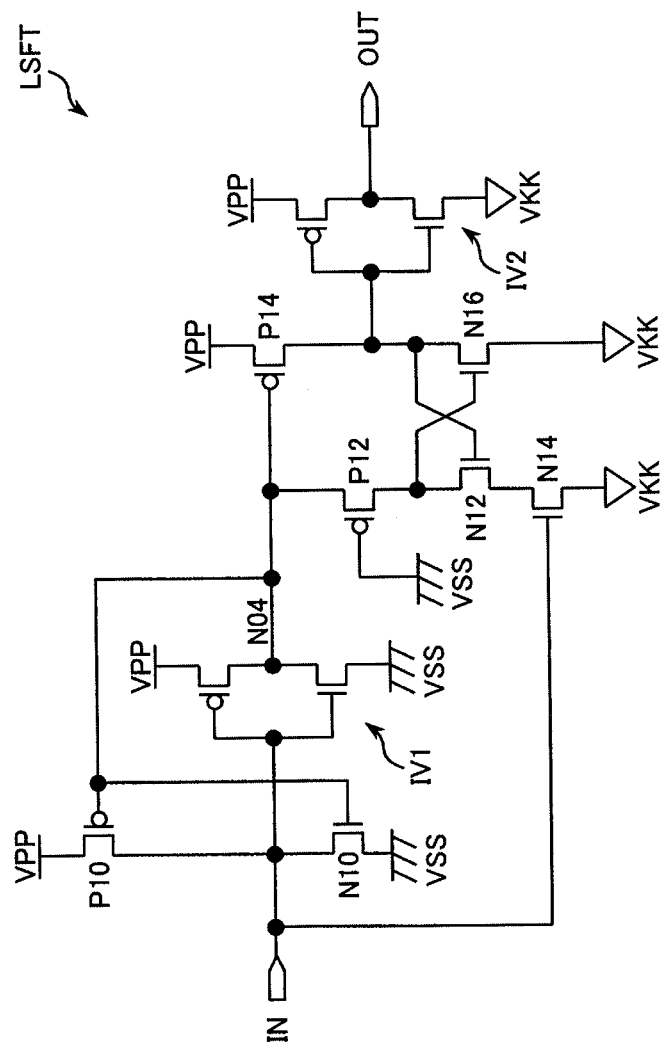
FIG. 16 illustrates an example of the level shifter LSFT illustrated in FIGS. 14 and 15.

FIG. 16 illustrates an example of the level shifter LSFT illustrated in FIGS. 14 and 15. The level shifter LSFT has pMOS transistors P10, P12, and P14, nMOS transistors N10, N12, N14, and N16, and CMOS inverters IV1 and IV2. The sources of the pMOS transistors P10 and P14 and a power supply line of the CMOS inverters IV1 and IV2 are supplied with the boosted voltage VPP. A ground line of the CMOS inverter IV1, the source of the nMOS transistor N10, and the gate of the pMOS transistor P12 are supplied with the ground voltage VSS. The sources of the nMOS transistors N14 and N16 and the ground line of the CMOS inverter IV1 are supplied with the negative voltage VKK.

The pMOS transistor P10 and the CMOS inverter IV1 have a latch function to hold the low level of a node N04 if supplied with the high level at the input terminal IN. The nMOS transistor N10 and the CMOS inverter IV1 have a latch function to hold the high level of a node N04 if supplied with the low level at the input terminal IN. Further, the pMOS transistors P12 and P14 and the nMOS transistors N12, N14, and N16 have a function to hold the low level of the node N04. Accordingly, if supplied with the high level VPP at the input terminal IN, the level shifter LSFT outputs the low-level VKK from an output terminal OUT and, is supplied with the low-level VSS at the input terminal IN, outputs the high-level VPP from the output terminal OUT.

If supplied at the input terminal IN with the low level corresponding to a value of the row address signal BRA12-BRA0, the level shifter LSFT activates the corresponding real word line WL or the redundant word line RWL to the high-level VPP. Then, if the value of the row address signal BRA12-BRA0 changes, the nMOS transistors Na, Nc, etc. illustrated in FIGS. 14 and 15 are turned off to keep the input terminal IN in the low-level floating state. However, due to the low level of the input terminal IN, the node N04 is set to the high level, such that the nMOS transistor N10 is turned on.

Due to the latch function of the nMOS transistor N10 and the CMOS inverter IV1, the output terminal OUT is kept at the high level. The floating state of the input terminal IN (that is, the latched high-level state of the node N04) is kept until the timing signal WLOFF is set to the low level and the pMOS transistor Pa illustrated in FIGS. 14 and 15 is turned on. By utilizing it, the plurality of real word lines WL and a plurality of redundant word lines RWL are activated simultaneously by changing the row address signal BRA12-BRA0 in a period when the timing signal WLOFF is at the high level.

Figure 17:
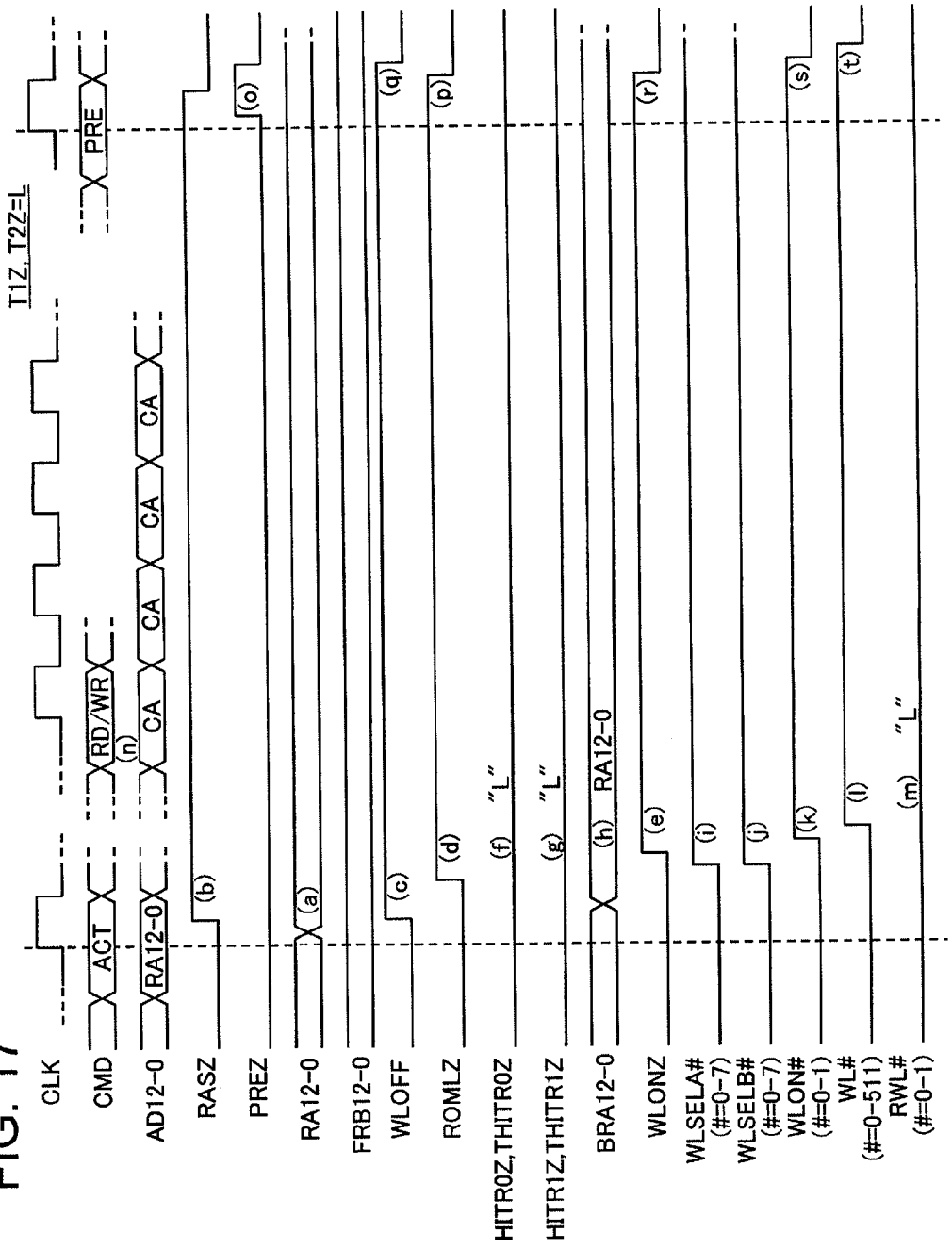
FIG. 17 illustrates an example of operations of the semiconductor memory MEM illustrated in FIG. 2 in the normal operation mode.

FIG. 17 illustrates an example of operations of the semiconductor memory MEM illustrated in FIG. 2 in the normal operation mode (a real word line WL is selected when no addresses are agreed or no real word line replacement with redundant word line). In this example, the value of the row address signal RA12-RA0 supplied along with the activate command ACT is different from that denoting a faulty real word line WL programmed in all of the redundancy decision circuits 42. Alternatively, all of the redundancy decision circuits 42 are yet to be programmed. In the normal operation mode, the test mode signals T1Z and T2Z are deactivated to the low level L.

The row address latch circuit 40 illustrated in FIG. 5 latches the word address signal RA12-RA0 ((a) of FIG. 17). In response to the activate command ACT, the command signal RASZ, the timing signal WLOFF, and the timing signals ROMLZ and WLONZ are activated to the high level in sequence ((b), (c), (d), (e) of FIG. 17). The value of the word address signal RA12-RA0 disagrees with the value of the row address signal FB12-FB0 output by the address conversion circuit ACNV in each of the redundancy decision circuit 42. Alternatively, the fuse latch circuit FLT1 in each redundancy decision circuit 42 has its fuse FS yet to be blown and, therefore, outputs the high-level judge signal JDGF.

The row addresses RA12-RA0 and FB12-FB0 disagree or all of the judge signals JDGF are at the high level, to keep the hit signals HITR0Z, HITR1Z, THITR0Z, and THITR0Z at the low level ((f), (g) of FIG. 17). The row address selection circuit 44 illustrated in FIG. 11 output a signal as the row address signal BRA12-BRA0 ((h) of FIG. 17).

The row pre-decoder WLPDEC illustrated in FIG. 14 sets the decode signals WLSELA and WLSELB to the high level in accordance with the row address signal BRA7-BRA0 ((i), (j) of FIG. 17). The row block decoder RBDEC activates one of the decode signals WLON0-1 of any one of the memory blocks RBLK0-RBLK15 in accordance with the row address signal BRA12-BRA8 ((k) of FIG. 17). Accordingly, one of the real word lines WL which is denoted by the row address signal RA12-RA0 is activated to the high level ((l) of FIG. 17). The redundant word line RWL is kept in the deactivated state ((m) of FIG. 17).

Then, for example, along with the read command RD or the write command WR to be supplied to the command decoder 10, the column address signal CA is supplied in sequence ((n) of FIG. 17). Then, read or write operations are performed to the memory cell MC connected to the activated real word line WL. FIG. 17 illustrates an example of the burst length being "4". The burst length refers to the number of data pieces which are read sequentially from the semiconductor memory MEM in response to the read command RD at a time or the number of data pieces which are written sequentially to the semiconductor memory MEM in response to the write command WR at a time.

After accessing the memory cell MC connected to the activated real word line WL, the pre-charge command PRE is supplied to the command decoder 10 to activate the command signal PREZ temporarily ((o) of FIG. 17). In response to the pre-charge signal PREZ, the command signal RASZ and the timing signals ROMLZ, WLOFF, WLONZ, and WLON are deactivated to the low level in sequence ((p), (q), (r), (s) of FIG. 17). Then, the real word line WL is deactivated to complete the access operations ((t) of FIG. 17).

Figure 18:
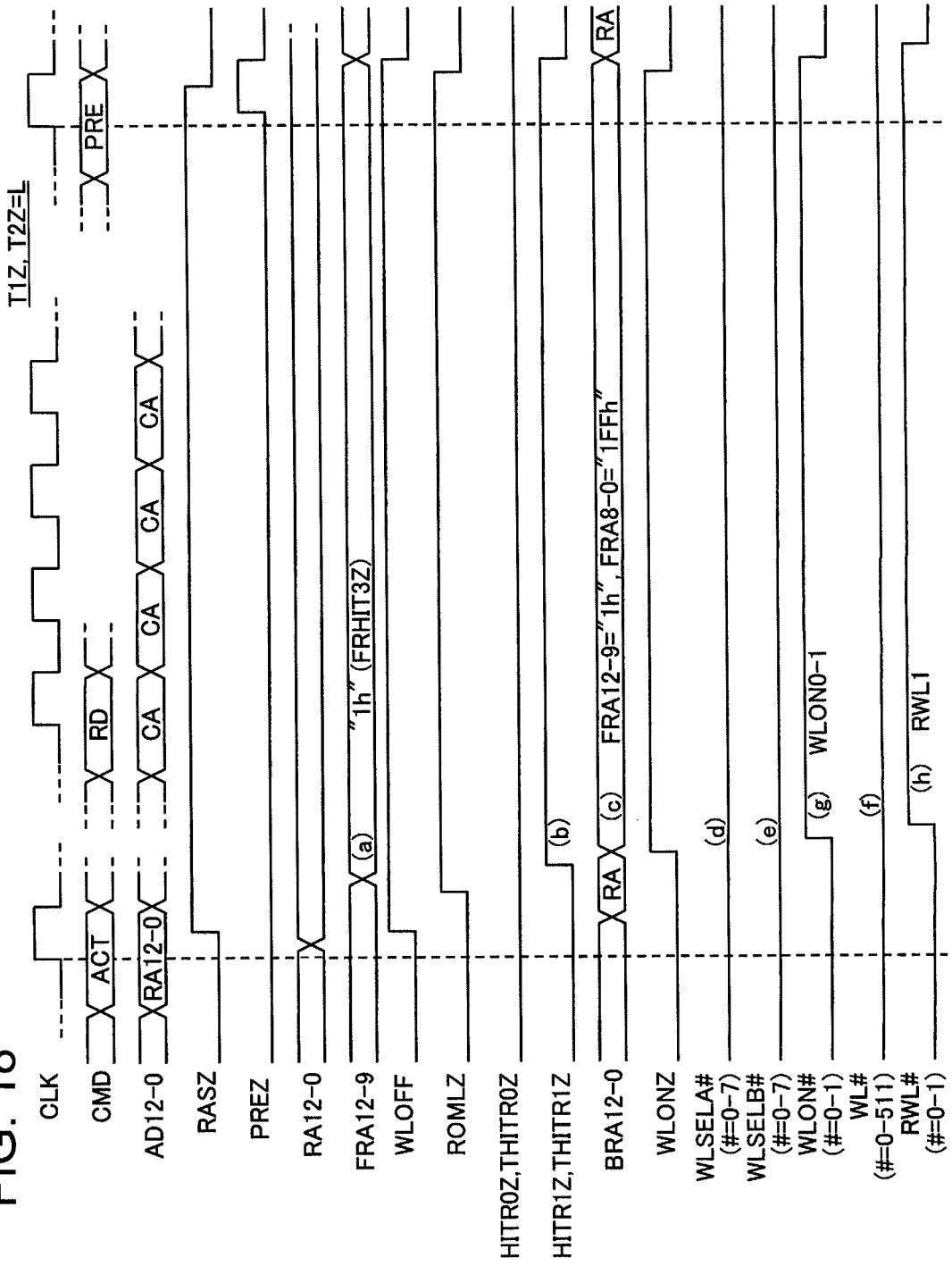
FIG. 18 illustrates another example the operations of the semiconductor memory MEM illustrated in FIG. 2 in the normal operation mode.

FIG. 18 illustrates another example the operations of the semiconductor memory MEM illustrated in FIG. 2 in the normal operation mode (a redundant word line WL is selected when addresses are agreed and a real word line being replaced with a redundant word line). Detailed description of the same operations as those in FIG. 17 will be omitted. In this example, the value of the row address signal RA12-RA0 supplied along with the activate command ACT denotes a faulty real word line WL programmed in one of the redundancy decision circuits 42. The command signal CMD, the external address signals AD12-AD0, the command signals RASZ and PREZ, and the timing signals ROMLZ, WLOFF, WLONZ, and WLON have the same waveforms as those in FIG. 17.

The value of the row address signal RA12-RA0 agrees with the value of the row address signal FB12-FB0 which is output by the address conversion circuit ACNV in one of the redundancy decision circuits 42. In this example, the address comparison circuit ACMP corresponding to the hit signal FRHIT3Z detects agreement, such that the hit signal FRHIT3Z is activated. In response to the activation of the hit signal FRHIT3Z, the hit signal generation circuit HITGEN illustrated in FIG. 6 outputs the row address signal FRA12-FRA9 having value "1h" and the hit signal HITR1Z in accordance with the rules illustrated in FIG. 8 ((a), (b) of FIG. 18). In response to the hit signal HITR1Z, the hit signal THITR1Z is activated.

In response to the activation of the hit signal HITR1Z, the row address selection circuit 44 illustrated in FIG. 11 outputs the row address signal FRA12-FRA9 having value "1h" and the row address signal FRA8-FRA0 having value "1FFh" as the row address signal BRA12-BRA0 ((c) of FIG. 18). In response to the activation of the hit signal HITR1Z, the row pre-decoder WLPDEC illustrated in FIG. 14 prohibits activation of all the decode signals WLSELA and WLSELB to keep them at the low level ((d), (e) of FIG. 18). Accordingly, the real word line WL corresponding to the row address signal RA12-RA0 is not activated and kept at the low level ((f) of FIG. 18).

If supplied with the hit signal THITR1Z, the row block decoder RBDEC illustrated in FIG. 13 masks the logic of the row address signal BRAG. The row block decoder RBDEC activates both of the decode signals WLON0 and WLON1 of the memory block RBLK corresponding to a value of the row address BRA12-BRA8 to the high level ((g) of FIG. 18). If supplied with the high-level decode signals WLON0-WLON1 and the high-level hit signal THITR1Z, the redundant word line RWLDEC illustrated in FIG. 15 activates the redundant word line RWL1 to the high level ((h) of FIG. 18). Then, read or write operations are performed to the memory cells MC connected to the redundant word line RWL1 which is activated in place of the real word line WL. FIG. 18 also illustrates the example of the burst length being "4". In the ordinary operation in the FIGS. 17 and 18, the row address control unit 22 in FIGS. 2 and 5 operates as follows. The row address latch circuit 40 latches the external address AD12-AD0 and output the row address RA12-RA0. The redundancy decision circuit 42 decides if the row address RA12-RA0 is agreed with faulty address. (1) If no agreement, the redundancy decision circuit 42 output the inactive (L-level) hit signals HITR0Z-1Z, so the row address selection circuit 44 (FIG. 11) selects the external row address RA12-RA0 and output them as the row address BRA12-BRA0 to the word line control circuit 26 (FIGS. 2, 12). Accordingly, the word line control circuit 26 selects one of the real word lines WL255-WL0. (2) If agreement, the redundancy decision circuit 42 output the redundant row address FRA12-FRA9 for selecting one of 16 row memory blocks RBLK0-15, and the active (H-level) hit signal (one of HITR0Z-1Z) for selecting one of the redundant word lines RWL0, RWL1. And, in response to the active hit signal HITR0Z or HITR1Z, the row address selection circuit 44 (FIG. 11) selects the redundant row address FRA12-FRA9 and output them as the row address BRA12-BRA9, and H-level row address as the row address BRA8-BRA0. Accordingly, the word line control circuit 26 selects one of the redundant word lines RWL0 of RWL1 in one of 16 row memory blocks RMBL0-15. In this case, all the real word lines WL are not selected.

Figure 19:
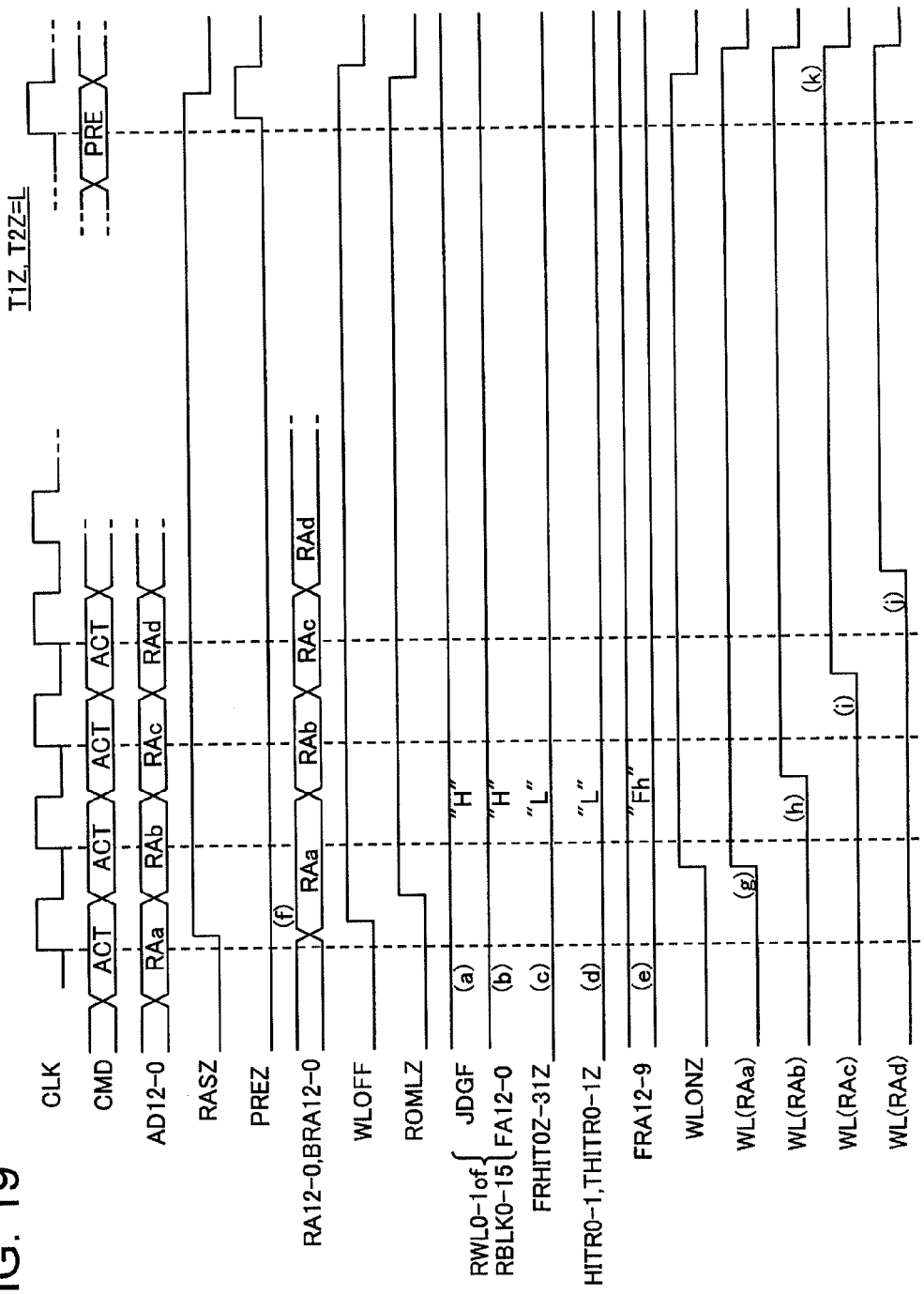
FIG. 19 illustrates an example of a multi-selection test on the real word lines WL in the semiconductor memory MEM illustrated in FIG. 2.

FIG. 19 illustrates an example of a multi-selection test on the real word lines WL in the semiconductor memory MEM illustrated in FIG. 2. Detailed description of the same operations as those in FIG. 17 will be omitted. The real word line WL multi-selection test is performed before programming the fuse FS of the redundancy decision circuit 42 and is performed in the normal operation mode without entering the test mode.

In the normal operation mode used by the user, it is prohibited to supply a plurality of the activate commands ACT sequentially to the semiconductor memory MEM without supplying the pre-charge command PRE (illegal command). Accordingly, in a system mounted with the semiconductor memory chip MEM, the operations in FIG. 19 are not performed. In other words, in the normal operation mode used by the user, the plurality of real word lines WL connected to the common bit lines BL and /BL via the memory cells MC are not selected simultaneously. Therefore, the operations in FIG. 19 are handled as those in one of the test modes.

In the real word line WL multi-selection test, the plurality of activate command ACT are sequentially supplied to the semiconductor memory MEM along with the different external address signals AD12-AD0. In this example, the external address signals AD12-AD0 supplied in sequence may be row address signals RAa, RAb, RAc, and RAd.

The command signals RASZ and PREZ and the timing signals ROMLZ, WLOFF, WLONZ have the same waveforms as those in FIG. 17. Since the fuse FS is not programmed (blown), after power-on reset, the fuse latch circuits FLT1 and FLT2 in all of the redundancy decision circuits 42 output the high-level judge signal JDGF and the high-level row address signals FA12-FA0 ((a), (b) of FIG. 19). Accordingly, the hit signals FRHIT0Z-FRHIT31Z are kept at the low level ((c) of FIG. 19). The hit signal generation circuit HITGEN sets HITR0Z-HITR1Z to the low level and the row address signals FRA12-FRA9 to "Fh" ((d), (e) of FIG. 19). In the normal operation mode, the test mode signals T1Z and T2Z are deactivated to the low level, such that the hit signals THITR0Z-THITR1Z are also kept at the low level.

Since none of the hit signals HITR0Z-HITR1Z and THITR0Z-THITR1Z is activated, the row address selection circuit 44 illustrated in FIG. 11 sequentially outputs the row address signals RAa, RAb, RAc, and RAd as the row address signals BRA12-BR0 ((f) of FIG. 19).

First, the word line driver WLDRV (FIG. 14) corresponding to the row address signal RAa activates the real word line WL (RAa) ((g) of FIG. 19). If the value of the row address signal BRA12-BRA0 is switched from RAa to RAb, the word line driver WLDRV corresponding to the row address signal RAb activates the real word line WL (RAb) ((h) of FIG. 19). At this point in time, the timing signal WLOFF is kept at the high level, the node NO3 of the word line driver WLDRV corresponding to the row address signal RAa is kept in the low level floating state. Therefore, the level shifter LSFT supplied with the low level keeps the high level of the real word line WL (RAa).

Similarly, if the value of the row address signal BRA12-BRA0 is switched from RAc or RAd, the already activated real word lines WLs (RAa, RAb) are not deactivated and the next real word lines WL (RAc, RAd) are activated in sequence ((i), (j) of FIG. 19). Accordingly, the real word line WL multi-selection test is performed. By the multi-selection test, it is possible to simultaneously apply stress on the plurality of word lines WL and the plurality of memory cells MC connected to those real word lines WL thereby performing the stress test such as the burn-in test.

In this case, arbitrary real word lines WL are activated redundantly, such that stress is applied in condition where a desired test pattern is written to the memory cells MC. Further, by sequentially activating the plurality of real word lines WL in response to the activate command ACT, a temporary drop of the boosted voltage line VPP (generation of power source noise) is prevented. As a result, it is unnecessary to design the internal voltage generation unit 32 having the high function to generate the boosted voltage VPP for the purpose of the multi-selection test. Further, the boosted voltage VPP need not be supplied from the outside of the semiconductor memory MEM via a special power supply pad either. The real word lines WL (RAa, RAb, RAc, RAd) are deactivated when the timing signals WLONZ and WLOFF changes to the low level in response to the pre-charge command PRE ((k) of FIG. 19).

Figure 20:
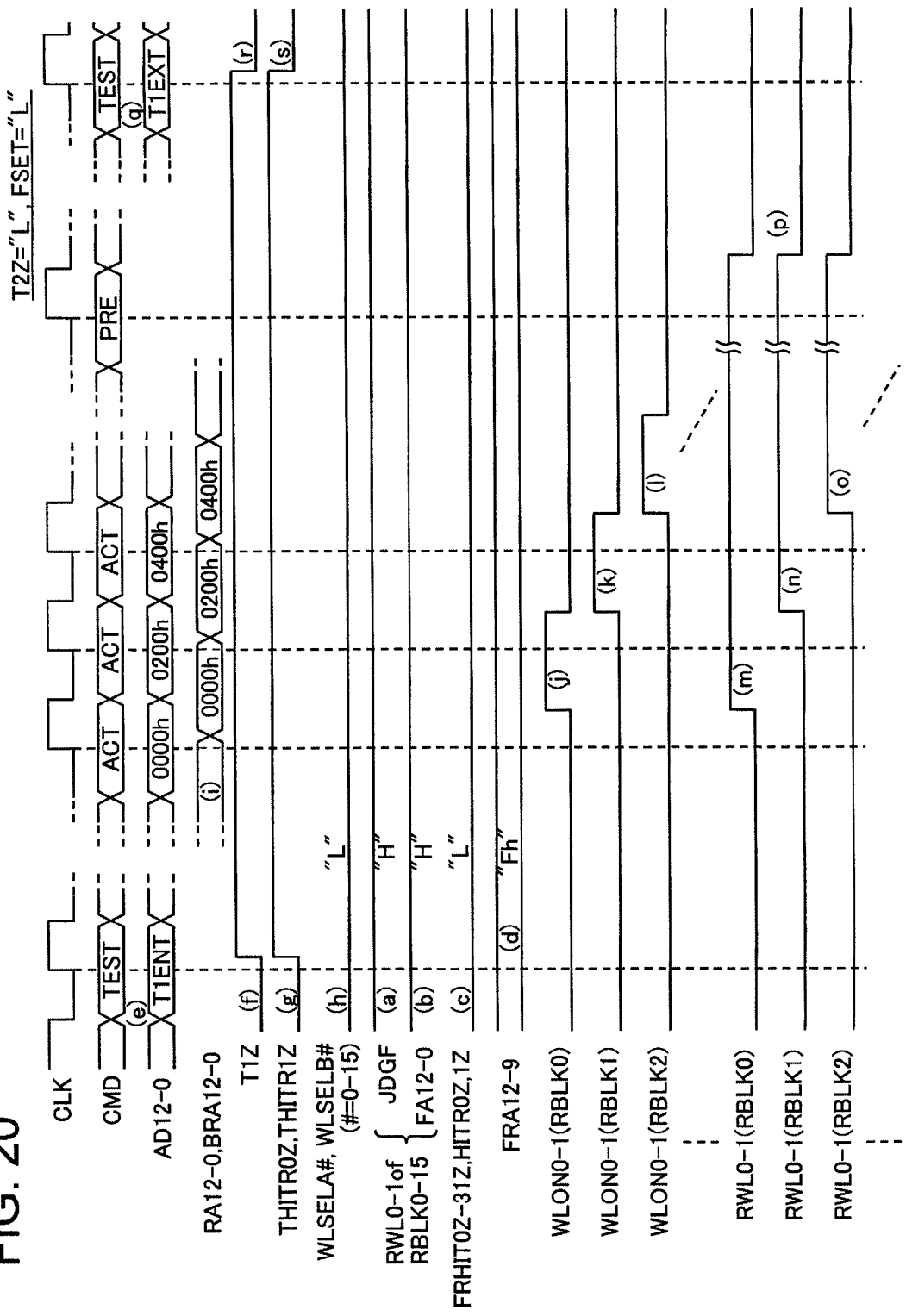
FIG. 20 illustrates an example of the multi-selection test on the redundant word lines RWL in the first test mode of the semiconductor memory MEM illustrated in FIG. 2.

FIG. 20 illustrates an example of the multi-selection test on the redundant word lines RWL in the first test mode of the semiconductor memory MEM illustrated in FIG. 2. Detailed description of the same operations as those in FIGS. 10, 17, and 19 will be omitted. The command signals RASZ and PREZ and the timing signals ROMLZ, WLOFF, WLONZ have the same waveforms as those in FIG. 17 and are not illustrated.

The redundant word line RWL multi-selection test is performed before the fuse FS in the redundancy decision circuit 42 is programmed and is performed in the first test mode. Since the fuse FS is not programmed (blown), similar to the case of FIG. 19, after power-on reset, all of the redundancy decision circuits 42 output the high-level judge signal JDGF and the high-level row address signals FA12-FA0 ((a), (b) of FIG. 20). Accordingly, the redundancy decision circuit 42 keeps FRHIT0Z-FRHIT31Z and HITR0Z and HITR1Z at the low level and sets the row addresses FRA12-FRA9 to "Fh" ((c), (d) of FIG. 20).

In this state, along with the test command TEST to be supplied to the command terminal CMD, the external address signal AD12-AD0 (T1ENT) denoting the entry of the first test mode is supplied to the semiconductor memory MEM ((e) of FIG. 20). The test control unit 12 illustrated in FIG. 2 activates the test mode signal T1Z in response to the test command TEST ((f) of FIG. 20). In response to the activation of the test mode signal T1Z, the state of the semiconductor memory MEM shifts from the normal operation mode to the first test mode. The row address control unit 22 illustrated in FIG. 5 activates both of the hit signal THITR0Z and THITR1Z in response to the activation of the test mode signal T1Z ((g) of FIG. 20).

In response to the activation of the hit signals THITR0Z and THITR1Z, the row pre-decoder WLPDEC illustrated in FIG. 14 keeps all of the decode signals WLSELA and WLSELB at the low level ((h) of FIG. 20). Accordingly, it is possible to prohibit activation of the real word lines WL by the row address signal RA12-RA0, thereby preventing activation of the unintended real word lines WL in multi-selection of the redundant word lines RWL. That is, only a desired redundant word line RWL is activated.

Since the hit signals HITR0Z-HITR1Z are not activated, the row address selection circuit 44 illustrated in FIG. 11 sequentially outputs the row address signals RA12-RA0 as the row address signals BRA12-BRA0 ((i) of FIG. 20). For example, the row address signals RA12-RA0 sequentially supplied to the address terminal AD may be "0000h", "0200h", and "0400h". The high-order four bits RA12-RA9 of the row address signal RA are "0h", "1h", and "2h" and may be addresses which are respectively assigned to the redundant word lines RWL0-RWL1 in the memory blocks RBLK0-RBLK2.

In response to the activation of the hit signals THITR0Z and THITR1Z, the row block decoder RBDEC illustrated in FIG. 13 invalidates the logic of the row address signal BRAG. Then, according to the row address signal BRA12-BRA9, the row block decoder RBDEC simultaneously activates the decode signals WLON0 and WLON1 corresponding to any one of the memory blocks RBLK0-RBLK15 ((j), (k), (l) of FIG. 20). The redundant word line decoder RWLDEC (FIG. 15) corresponding to the memory blocks RBLK0-RBLK2 simultaneously activates the redundant word lines RWL0 and RWL1 in response to the activation of the decode signals WLON0 and WLON1 ((m), (n), (o) of FIG. 20). Similar to the case of FIG. 19, the activated state of the redundant word lines RWL0-RWL1 is kept until the pre-charge command PRE is supplied and the timing signal WLOFF changes to the low level. That is, the redundant word lines RWL0-RWL1 of the plurality of memory blocks RBLK0-RBLK2 are activated redundantly with each other to perform the multi-selection test.

In the present embodiment, in the first test mode, the row address selection circuit 44 receiving both inactive (L-level) hit signals HITR0Z and HITR1Z operates in condition where it is not hit, so as to select the external row address RA12-RA9. On the other hand, the row pre-decoder WLPDEC and the row block decoder RBDEC receiving both active (H-level) hit signals THITR0Z and THITR1Z are operated in condition where they are hit, so that all real word lines WL are non-selected by the row pre-decoder WLPDEC and a redundant word line RWL (in a row memory block RBLK) is selected through decoding the external row address RA12-RA9 by the row block decoder RBDEC. It makes redundantly activate arbitrary redundant word lines RWL by using the external address signals AD supplied from the outside of the semiconductor memory MEM without activating the real word lines WL. As the result, it is possible to simultaneously apply stress on the plurality of redundant word lines RWL and the plurality of memory cells MC connected to those redundant word lines RWL, whereby the stress test such as a burn-in test is performed. Since the arbitrary redundant word lines RWL is activated redundantly, it is possible to apply stress in condition where a desired test pattern is written to the memory cells MC.

The activated redundant word lines RWL are deactivated in response to the pre-charge command PRE ((p) of FIG. 20). Subsequently, along with the test command TEST to be supplied to the command terminal CMD, the external address signals AD12-AD0 (T1EXT) denoting the exit of the first test mode is supplied to the semiconductor memory MEM ((q) of FIG. 20). Accordingly, the test mode signal T1Z is deactivated and the hit signals THITR0Z and THITR1Z are deactivated (r), (s) of FIG. 20). Then, the semiconductor memory MEM returns from the first test mode to the normal operation mode.

Before supplying the pre-charge command PRE, the first test mode may be exited to perform the real word line WL multi-selection test illustrated in FIG. 19. In this case, it is possible to redundantly activate a plurality of the arbitrary redundant word lines RWL and a plurality of the arbitrary real word lines WL. Generally, the redundant word lines RWL are formed along with the real word lines WL by using the same layout rules as those for the real word lines WL. Accordingly, the stress test is performed over the redundant word lines RWL and real word lines WL by simultaneously activating those word lines without distinguishing the former from the latter. Moreover, in the real word line WL multi-selection test illustrated in FIG. 19, before supplying the pre-charge command PRE, it is possible to redundantly activate the plurality of arbitrary redundant word lines RWL and the plurality of arbitrary real word lines WL after the entry to the first test mode.

Furthermore, at least three redundant word lines RWL may be formed in each memory block RBLK. Further, the hit signals THITR0Z and THITR1Z may be able to be activated selectively in accordance with the value of the external address AD supplied along with the test command TEST. In this case, in the row block decoder RBDEC illustrated in FIG. 13, the decode signal WLON0 is activated in accordance with the OR logic of the hit signal THITR0Z and the inverted row address signal BRA8. The decode signal WLON1 is activated in accordance with the OR logic of the hit signal THITR1Z and the row address signal BRA8. It is thus possible to activate the redundant word lines RWL0 and RWL1 individually in the first test mode.

In the first test operation of the FIG. 20, the row address control unit 22 in FIGS. 2 and 5 operates as follows. The row address latch circuit 40 latches the external address AD12-AD0 and output the row address RA12-RA0. Since the fuse FS in the redundant address memory in the redundancy decision circuit 42 are all not blown in the first test mode, the hit signals HITR0Z-1Z are both inactive (L-level). Accordingly, the row address selection circuit 44 (FIG. 11) selects the redundant row address FRA12-FRA9 and output them as the row address BRA12-BRA9, and H-level row address as the row address BRA8-BRA0. So, the word line control circuit 26 selects one of 16 row memory blocks RMBL0-15 and selects the redundant word lines RWL0-1 in the selected row memory block RBLK. In this case, according to the activation (H-level) of the first test mode signal T1Z, the test circuit (OR gates) activates the test signals THITR0Z-1Z (H-level), the NOR gates of the row pre-decoder WLPDEC (FIG. 14) in the word line control unit 26 (FIG. 12) activate THITRX (L-level), so that the real word lines are all not selected.

And in the first test mode, in response to continuously supplied active command ACT with different row address RA12-RA9, the redundant word decoders RWLDEC, respectively provided at each of 16 row memory blocks RBLK0-15 in the word line control unit 26 (FIG. 12), sequentially select the redundant word lines RWL0-RWL1 in the row memory blocks so that the redundant word lines are multi-selected. In this state, the redundant word decoder RWLDEC (FIG. 15) in the word line control unit 26 simultaneously selects both of the redundant word lines RWL0-1 in each row memory block, according to the activation (H-level) of the hit signal THITR0Z-1Z and the activation (H-level) of pre-decode signal WLON0-1.

As explained above, in the first test mode, arbitrary redundant word line RWL is selected according to the supplied external row address RA12-9, and when the active commands with sequentially changing row address RA12-RA9 are input, a plurality of redundant word lines RWL are multi-selected. After multi-selected the plurality of redundant word lines RWL, such multi-selected state is reset in response to the pre-charge command.

Figure 21:
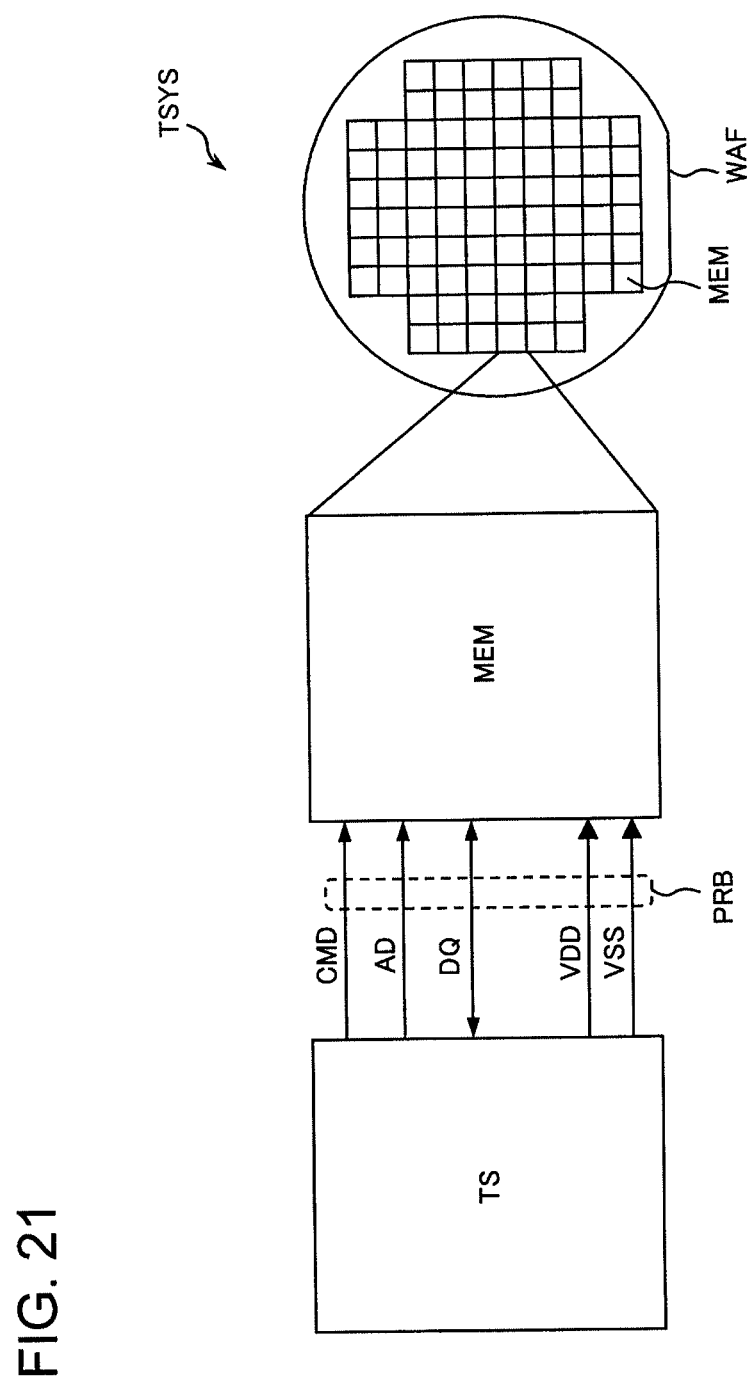
FIG. 21 illustrates an example of a test system TSYS which tests the semiconductor memory MEM.

FIG. 21 illustrates an example of a test system TSYS which tests the semiconductor memory MEM. The test system TSYS is used in steps of manufacturing the semiconductor memory MEM. The semiconductor memory MEM is manufactured by performing the later-described test.

First, a plurality of the semiconductor memories MEM are formed on a semiconductor wafer WAF in the semiconductor manufacturing processes. The semiconductor memory MEM is tested with a tester TS before it is cut out of the semiconductor wafer WAF. The tester TS supplies not only a control signal but also the power supply voltage VDD and the ground voltage VSS. The tester TS is one example of a controller which controls access of the semiconductor memory MEM.

The semiconductor memories MEM is connected to the tester TS via, for example, a probe card's probe PRB. In FIG. 21, one semiconductor memory MEM is connected to the tester TS; however, a plurality of the semiconductor memories MEM may be connected to the tester TS at a time. The number of the semiconductor memories MEM that are connected to the tester TS at a time depends on the number of the terminals of the tester TS and the number of the terminals of the semiconductor memory MEM.

The tester TS supplies the semiconductor memory MEM with the command signal CMD, the external address signal AD, and the data signal DQ and receives the read data signal DQ from the semiconductor memory MEM. The tester TS may be used to test the packaged semiconductor memories MEM.

Figure 22:
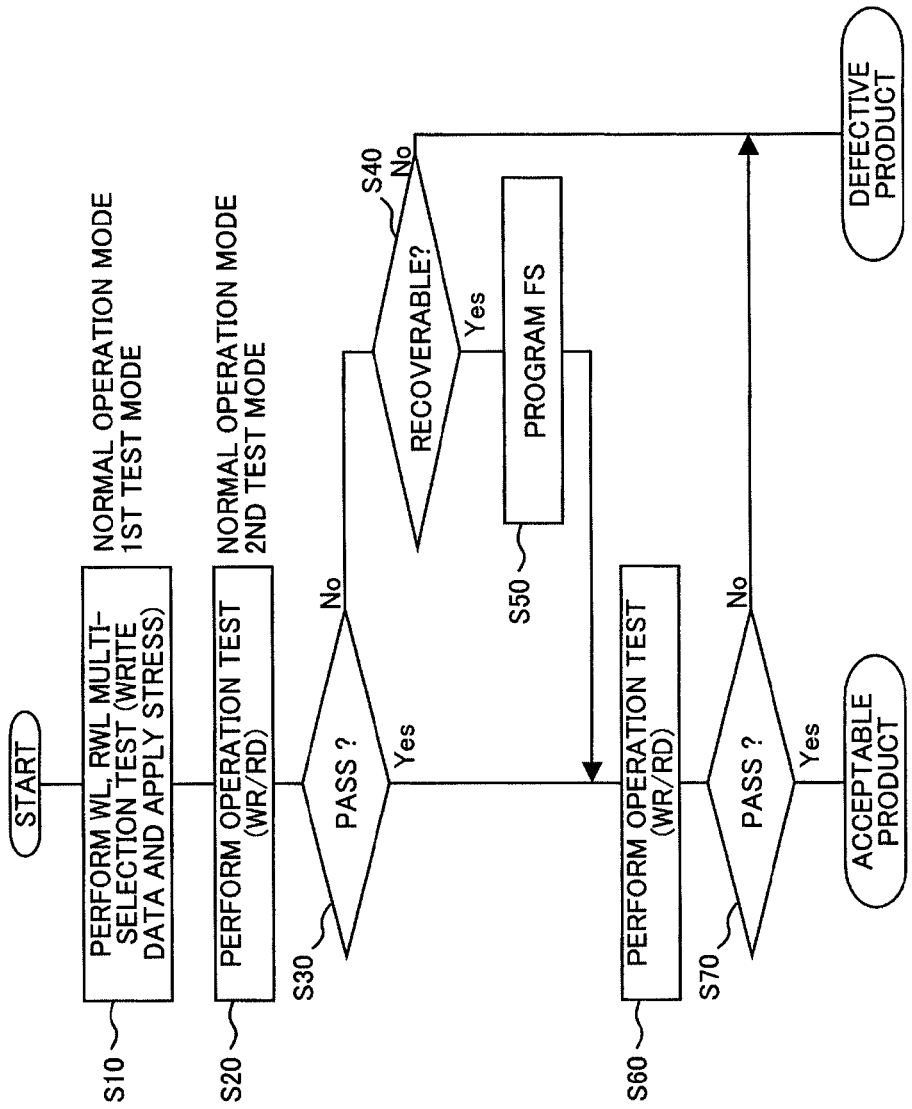
FIG. 22 illustrates an example of the semiconductor memory MEM manufacturing method.

FIG. 22 illustrates an example of the semiconductor memory MEM manufacturing method. A flow illustrated in FIG. 22 illustrates the process of testing the semiconductor memories MEM in the wafer state after wafer processes are completed. For example, the semiconductor memories MEM will be tested using the tester TS illustrated in FIG. 21.

First, in step S10, the tester TS simultaneously activates the plurality of real word lines WL in the normal operation mode. Next, the tester TS simultaneously activates the plurality of redundant word lines RWL in the first test mode. As described in FIG. 20, the real word lines WL and the redundant word lines RWL may be activated simultaneously. Further, write operations may be performed in condition where the plurality of word lines WL and RWL are in the activated state, to write the same logic data into the plurality of memory cells MC connected to the common bit line BL (or /BL). By repeating activation of a predetermined number of the word lines WL and RWL, writing of the data, and pre-charge operations, it is possible to write a desired pattern of data to the memory cells in the memory cell array 28.

Step 10 enables applying stress on the word lines WL and RWL or on the memory cells MC. That is, in step 10, a stress test is performed. In the present embodiment, a plurality of arbitrary word lines WL and RWL are selected to apply stress on them, thereby applying stress by using a specific pattern (pattern of data to be written to the memory cells MC or a voltage pattern for the word lines WL and RWL). It is thus possible to perform the burn-in test etc. securely, thereby securely making faulty the semiconductor memories MEM that should be faulty initially. As a result, it is possible to reduce a reject rate in the market, thereby improving reliabilities of the semiconductor memory MEM and the system mounted with the semiconductor memory MEM.

Next, in step S20, the tester TS performs an operation test on the memory cells MC connected to the real word lines WL in the normal operation mode. Next, the tester TS performs the operation test on the memory cells MC connected to the redundant word lines RWL in the second test mode. The operation test is performed by carrying out a write operation WR to write a predetermined pattern of data to the memory cells MC and then a read operation RD to read the data from the memory cells MC to compare the data to an expected value. Rather than performing the operation test on the real word lines WL and the redundant word lines RWL respectively, the data may be written to the memory cells MC connected to the real word lines WL and the redundant word lines RWL and read from these cells.

In step S30, the tester TS distinguishes between the semiconductor memories MEM that have passed the operation test and those that have failed in the operation test in step 20. That is, the semiconductor memories MEM are decided on whether they are faulty or not. In step S40, the tester TS decides whether the semiconductor memories MEM that have failed in the test are capable of fault recovery. That is, whether fault recovery is possible on them is decided using the redundant word lines RWL. The semiconductor memories MEM judged incapable of fault recovery are handled as defective products.

In step S50, the fuses FS of the semiconductor memories MEM judged capable of fault recovery are programmed. In a case where the fuses FS are made of aluminum etc., the wafer on which the semiconductor memories MEM are formed moved from the tester TS to a laser repair device etc., where the fuses FS are blown. Step S50 is a fault recovery process.

In step S60, in the normal operation mode, the tester TS sequentially supplies the external address signals AD to the semiconductor memories MEM and performs the write operations WR as well as the read operations RD and the operation test. In the operation test, the redundant word line RWL is selected in place of the real word line WL corresponding to an address programmed in the fuse latch circuit FLT2 in the redundancy decision circuit 42. It is thus possible for the tester TS to confirm that the fuser FS is programmed properly.

In step S70, the tester TS distinguishes between the semiconductor memories MEM that have passed the operation test and those that have failed in the operation test in step 60. The semiconductor memories MEM judged to have failed in the test in step S70 are handled as defective products. The semiconductor memories MEM judged to have passed the test in step S70 are handled acceptable products. The semiconductor memories MEM judged acceptable are cut out from the wafer and moved to the packaging process. Alternatively, the semiconductor memories MEM judged acceptable are shipped in the chip state or the wafer state.

Figure 23:
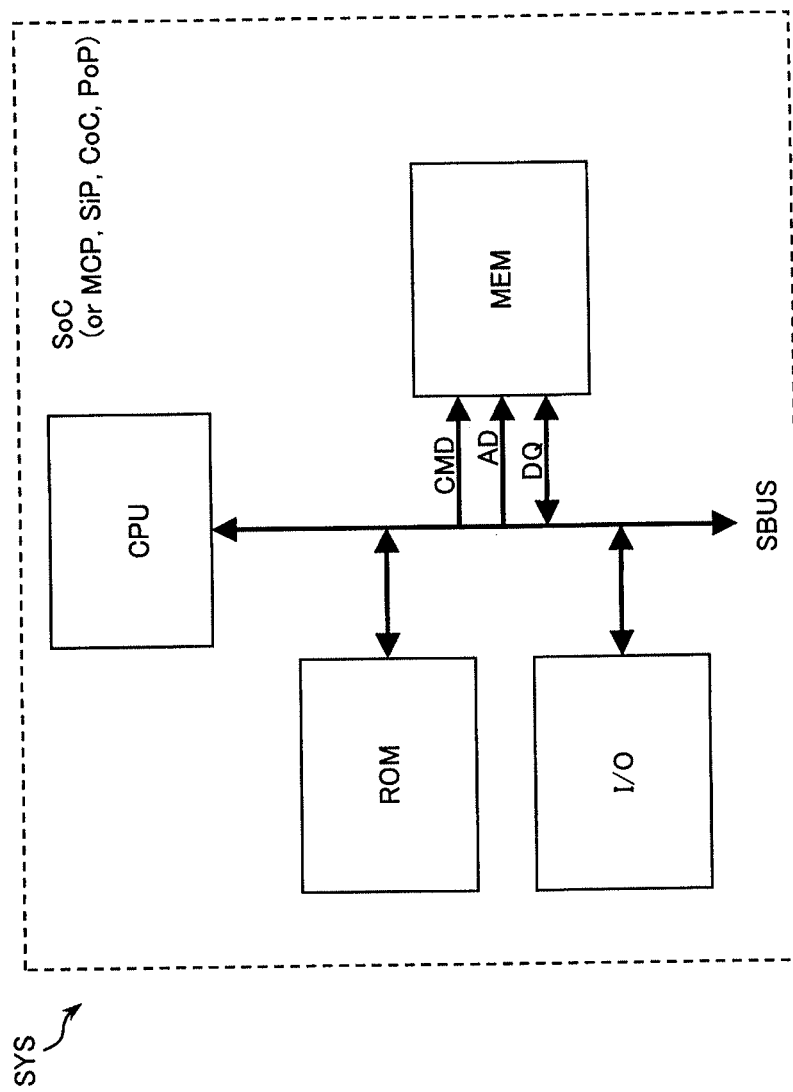
FIG. 23 illustrates an example of the system SYS mounted with the semiconductor memory MEM described above.

FIG. 23 illustrates an example of the system SYS mounted with the semiconductor memory MEM described above. The system SYS (user system) makes up at least one portion of the microcomputer system of, for example, a portable device. The system SYS has a system-on-chip SoC having a plurality of macros integrated on a silicon substrate. Alternatively, the system SYS has a multi-chip package MCP in which a plurality of chips are stacked on a package substrate. Alternatively, the system SYS has a system-in-package SiP in which a plurality of chips are mounted on a package substrate such as a lead frame. Further, the system SYS may be given in the form of a chip-on-chip CoC or a package-on-package PoP.

For example, the SoC has a central processing unit (CPU), a read only memory (ROM), a peripheral circuit I/O, and the above-described semiconductor memory MEM. The CPU is one example of a controller that controls access to the semiconductor memory MEM. The CPU, the ROM, the peripheral circuit I/O, and the semiconductor memory MEM are connected to each other by a system bus SBUS. Between the CPU and the semiconductor memory MEM, a memory controller may be disposed.

The CPU gains access to the ROM, the peripheral circuit I/O, and the semiconductor memory MEM and controls operations of the system as a whole. The semiconductor memory MEM performs the read and write operations in response to an access request from the CPU. The minimum configuration of the system SYS is the CPU and the semiconductor memory MEM.

As hereinabove described, the present embodiment provides almost the same effects as those by the earlier described embodiment. Moreover, in the first test mode, by redundantly selecting a plurality of the redundant word lines RWL in sequence, it is possible to simultaneously apply stress on the pluralities of redundant word lines RWL and the memory cells MC connected to the pluralities of redundant word lines RWL. As a result, it is possible to reduce the time for the stress test such as the burn-in test and the costs for testing.

The row address selection circuit 44 is controlled by the hit signals HITR0Z and HITR1Z, and the row pre-decoder WLPDEC is controlled by the hit signals THITR0Z and THITR1Z. Accordingly, the row address signal RA12-RA9 supplied to the address terminal AD is supplied to the row block decoder RBDEC via the row address selection circuit 44. Therefore, an arbitrary redundant word line RWL is activated on the basis of the row address signal RA12-RA9 without activating the real word lines WL. In other words, the row block decoder RBDEC is used also when selecting the real word lines WL and the redundant word lines RWL, while at the same time, the redundant word lines RWL are selected using the external address signals AD without selecting the real word lines WL.

The hit signals THITR0Z and THITR1Z contain the logic of the hit signals HITR0Z and HITR1Z which are output from the redundancy decision circuit 42, such that it is possible to select the redundant word lines RWL in accordance with faulty addresses programmed in the redundancy decision circuit 42 in the normal operation mode.

Figure 24:
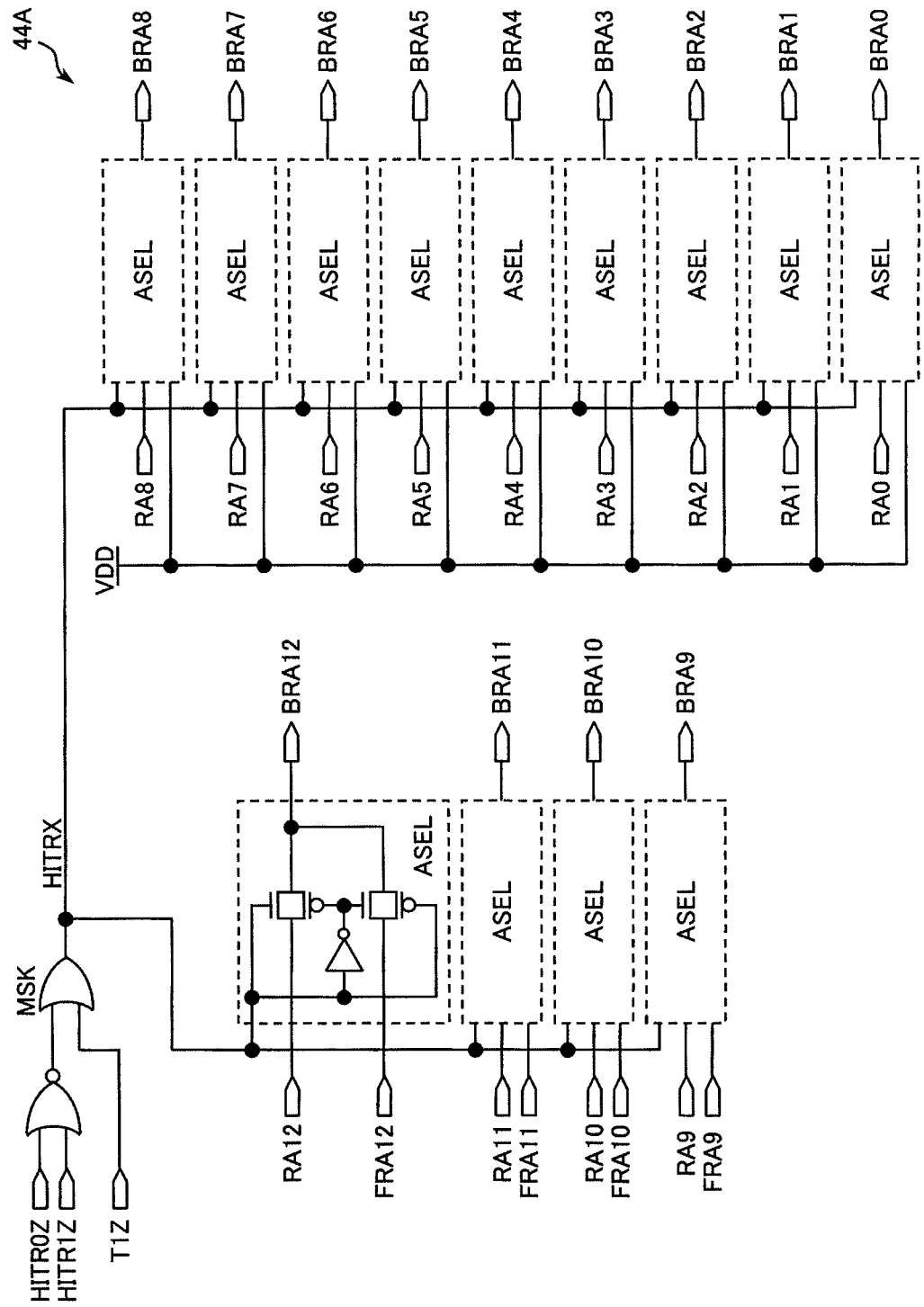
FIG. 24 illustrates an example of a row address selection circuit 44A in a further embodiment.

FIG. 24 illustrates an example of a row address selection circuit 44A in a further embodiment. Identical reference numerals are given to identical components in those embodiments, and repetitive detailed description on the identical components will be omitted. The row address selection circuit 44A is formed in place of the row address selection circuit 44 in FIG. 11 in the semiconductor memory MEM illustrated in FIG. 2. The other components of the semiconductor memory MEM are the same as those in FIG. 2.

The semiconductor memory MEM having the row address selection circuit 44A undergoes the test illustrated in FIG. 22 by using the test system TSYS illustrated in FIG. 21. That is, the semiconductor memory MEM having the row address selection circuit 44A undergoes the multi-selection test illustrated in FIGS. 19 and 20. Further, semiconductor memory MEM having the row address selection circuit 44A is mounted in the system SYS illustrated in FIG. 23.

The row address selection circuit 44A adds to the row address selection circuit 44 illustrated in FIG. 11 a mask circuit MSK that prohibits acceptance of the high-level hit signal HITR0Z or HITR1Z to forcedly set the hit signal HITRX to the high level when supplied with a high-level test mode signal T1Z. The mask circuit MSK enables setting the hit signal HITRX to the high level and outputting a row address signal RA12-RA0 as a row address signal BRA12-BRA0 irrespective of the programmed state of a redundancy decision circuit 42. Accordingly, the test is performed in a first test mode illustrated in FIG. 20 even after the fuses FS in fuse latch circuits FLT1 and FLT2 are blown.

The above embodiments have been described with reference to the example where the present invention would be applied to the semiconductor memory MEM having the real word lines WL and the redundant word lines RWL. However, the above embodiments may be applied to a semiconductor memory MEM in which word lines include main word lines and sub-word lines. For example, the last-stage CMOS inverter in the level shifter LSFT may be deleted to provide the above real word lines WL and redundant word lines RWL as real main word lines and redundant main word lines. The number of the real main word line in each memory block RBLK may be set to 128 and the row address signal RA1-RA0 may be supplied to a sub-word decoder in order to select the four real sub-word lines disposed for each real main word line. Four sub-word lines are arranged for each main word line. In this case, in the first test mode, a plurality of the redundant main word lines may be redundantly activated sequentially and a plurality of the redundant sub-word lines may be redundantly activated sequentially.

The above embodiments have been described with reference to the example where the present invention would be applied to the DRAM having the redundant word lines RWL. However, the above embodiments may be applied to any other semiconductor memories such as a static RAM (SRAM) having the redundant word lines RWL, a ferro-electric memory, a flash memory, a resistive RAM (ReRAM), a phase change RAM (PRAM), and a magneto-resistive RAM (MRAM). Further, the semiconductor memory MEM to which the present embodiments is applied is not limited to the address multiplex type and may be applied to the address non-multiplex type. In the case of the address non-multiplex type, the row address signal RA and the column address signal CA are supplied via the different address terminals simultaneously. In this case, the semiconductor memory MEM has an address buffer which receives the row address signal RA and the column address signal CA simultaneously and a command decoder which decodes a read command RD and a write command WR.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has been described in detail, it should be understood that the various changes, substitutions, and alterations could be made hereto without departing from the spirit and scope of the invention.

What is claimed is:

1. A semiconductor memory comprising:
a memory block having a plurality of real word lines and a plurality of redundant word lines;
a first decoder which decodes a first address to output a first decode signal, and is prohibited from decoding in a test mode, the first address being a portion of an external address received at an address terminal;
a second decoder which decodes a second address or a redundant address denoting the redundant word line used in fault recovery in a normal operation mode, and decodes the second address in the test mode, to output a second decode signal, the second address being another portion of the external address;

a first driver which selects the real word line in accordance with the first decode signal and the second decode signal; and
a second driver which selects the redundant word line in accordance with the second decode signal.

2. The semiconductor memory according to claim 1, further comprising:
a redundancy decision circuit which stores a faulty address denoting a faulty real word line and the redundant address and, when the faulty address agrees with the external address, outputs the redundant address and a hit signal;
a test circuit which outputs a test signal prohibiting decoding of the first decoder, when supplied with the hit signal or a test mode signal; and
a selection circuit which selects the external address when the hit signal is not output and selects the redundancy address when the hit signal is output, to output the selected address as the external address to the first decoder and the second decoder.

3. The semiconductor memory according to claim 2, wherein the selection circuit includes a mask circuit which prohibits reception of the hit signal in order to select the external address when supplied with the test mode signal.

4. A system comprising:
the semiconductor memory including
a memory block having a plurality of real word lines and a plurality of redundant word lines;
a first decoder which decodes a first address to output a first decode signal, and is prohibited from decoding in a test mode, the first address being a portion of an external address received at an address terminal;
a second decoder which decodes a second address or a redundant address denoting the redundant word line used in fault recovery in a normal operation mode, and decodes the second address in the test mode, to output a second decode signal, the second address being another portion of the external address;
a first driver which selects the real word line in accordance with the first decode signal and the second decode signal; and
a second driver which selects the redundant word line in accordance with the second decode signal; and
a controller which controls accesses of the semiconductor memory.

5. The system according to claim 4, wherein the controller:
generates the test signal to prohibit decoding by the first decoder;
performs a stress test by repeatedly supplying the second address to the semiconductor memory to multi-select the redundant word lines;
writes data to memory cells connected to the redundant word lines by supplying the second address along with a write command to the semiconductor memory;
reads the data from the memory cells connected to the redundant word lines by supplying the second address along with a read command to the semiconductor memory; and
decides whether the semiconductor memory is acceptable or not by comparing the read data to an expected value.

6. The system according to claim 5, wherein the controller:
repeatedly supplies the first and second addresses to the semiconductor memory to multi-select the real word lines and perform the stress test in a state where the real word line and the redundant word line are selected, before the test signal is generated or after generation of the test signal is stopped by multi-selecting the redundant word lines;
writes the data to the memory cells connected to the real word lines;
reads the data from the memory cells connected to the real word lines; and
decides whether the semiconductor memory is acceptable or not by comparing the read data with the expected value.

7. A method of manufacturing a semiconductor memory having a first decoder which decodes a first address to output a first decode signal and prohibits decoding when supplied with a test signal, a second decoder which decodes a second address to output a second decode signal, a first driver which selects a real word line in accordance with the first decode signal and the second decode signal, and a second driver which selects a redundant word line in accordance with the second decode signal,
the method comprising:
generating the test signal to prohibit decoding by the first decoder;
repeatedly supplying the second address to the semiconductor memory to multi-select the redundant word lines, and performing a stress test;
supplying the second address along with a write command to the semiconductor memory to write data to memory cells connected to the redundant word lines;
supplying the second address along with a read command to the semiconductor memory to read the data from the memory cells connected to the redundant word lines; and
comparing the read data with an expected value to decide whether the redundant word lines and the memory cells connected to the redundant word lines are acceptable or not.

8. The method according to claim 7, further comprising:
repeatedly supplying the first and second addresses to the semiconductor memory to multi-select the real word lines and perform the stress test in a state where the real word line and the redundant word line are selected before the test signal is generated or after generation of the test signal is stopped by multi-selecting the redundant word lines;
writing the data to the memory cells connected to the real word lines;
reading the data from the memory cells connected to the real word lines; and
deciding whether the semiconductor memory is acceptable or not by comparing the read data with the expected value.

9. A semiconductor memory, comprising:
a memory cell array having a plurality of real word lines, a plurality of redundant word lines, a plurality of bit lines crossing with the real and redundant word lines, a plurality of memory cells provided at crossing section of the real and redundant word lines and the bit lines; and
a row selection circuit configured to select the real word line or the redundant word line in accordance with a row address being supplied, wherein
the row selection circuit selects the real word line or the redundant word line at an ordinary operation, and simultaneously multi-selects desired redundant word lines selected in accordance with the row address at a first test mode.

10. The semiconductor memory according to claim 9, wherein the row selection circuit, in the first test mode, is continuously supplied with different row addresses to continuously select the redundant word lines, so that the desired redundant word lines are simultaneously multi-selected.

11. The semiconductor memory according to claim 10, wherein the row selection circuit selects the real word line or the redundant word line in accordance with the row address in response to an active command, selects the bit line in accordance with a column address in response to a read or write command, and complete the selection of the real word line or the redundant word line in response to a pre-charge command, further, the row selection circuit, in the first test mode, is continuously supplied with the active command and the different row addresses respectively to continuously selects the different redundant word lines corresponding to the different row addresses, so that the desired redundant word lines are simultaneously multi-selected.

12. The semiconductor memory according to claim 9, wherein the row selection circuit, in the first test mode, does not select all of the real word lines while simultaneously multi-selecting the desired redundant word lines.

13. The semiconductor memory according to claim 9, wherein the row selection circuit, at the ordinary operation, selects a real word line among the plurality of real word lines by decoding a first row address and a second row address when the first and second address do not match with a faulty row address denoting a faulty real word line and selects a redundant word line among the redundant word lines when the first and second address match with the faulty row address, at the first test mode, simultaneously multi-selects the desired redundant word lines selected based on the second row address and does not select all of the real word lines.

* * * * *